US011394219B2

(12) United States Patent
Purkayastha et al.

(10) Patent No.: US 11,394,219 B2
(45) Date of Patent: Jul. 19, 2022

(54) BATTERY MANAGEMENT SYSTEM AND METHOD

(71) Applicant: OXIS ENERGY LIMITED, Oxfordshire (GB)

(72) Inventors: Rajlakshmi Purkayastha, Oxfordshire (GB); Christopher Hale, Oxfordshire (GB)

(73) Assignee: OXIS ENERGY LIMITED, Abingdon (GB)

( * ) Notice: Subject to any disclaimer, the term of this patent is extended or adjusted under 35 U.S.C. 154(b) by 0 days.

(21) Appl. No.: 16/972,400

(22) PCT Filed: May 28, 2019

(86) PCT No.: PCT/GB2019/051448
§ 371 (c)(1),
(2) Date: Dec. 4, 2020

(87) PCT Pub. No.: WO2019/234390
PCT Pub. Date: Dec. 12, 2019

(65) Prior Publication Data
US 2021/0234386 A1   Jul. 29, 2021

(30) Foreign Application Priority Data
Jun. 7, 2018   (GB) ..................................... 1809377

(51) Int. Cl.
*G01R 31/392*   (2019.01)
*H02J 7/00*   (2006.01)
(Continued)

(52) U.S. Cl.
CPC ........ *H02J 7/0048* (2020.01); *G01R 31/3835* (2019.01); *G01R 31/3842* (2019.01);
(Continued)

(58) Field of Classification Search
None
See application file for complete search history.

(56) References Cited

U.S. PATENT DOCUMENTS

| 6,061,639 A | * | 5/2000 | Wistrand | ........... | G01R 31/3648 |
| | | | | | 702/63 |
| 6,765,389 B1 | | 7/2004 | Moore | | |

(Continued)

FOREIGN PATENT DOCUMENTS

| EP | 2 848 953 A1 | 3/2015 |
| WO | 2011/057846 A1 | 5/2011 |

OTHER PUBLICATIONS

International Search Report and Written Opinion dated Oct. 23, 2019, corresponding to International Patent Application No. PCT/GB2019/051448.
British Search and Examination Report dated Dec. 20, 2018, corresponding to GB Application No. GB1809377.3.

*Primary Examiner* — Jas A Sanghera
(74) *Attorney, Agent, or Firm* — Squire Patton Boggs (US) LLP

(57) ABSTRACT

A battery management system for determining a time series of normalised voltage of at least one battery cell corresponding to a time period during which a first current flows through the at least one battery cell. The battery management system comprises a cell monitoring device configured to measure a current flowing through the at least one battery cell and a voltage of the at least one battery cell at a plurality of different times during the time period; and a controller configured to determine a normalised voltage of the at least one battery cell for each of the plurality of different times, in dependence on the measured current and measured voltage corresponding to that time, wherein the determined normalised voltages at the plurality of different times form a times series of normalised voltage, wherein the normalised voltage at each of the plurality of different times corresponds (Continued)

to an estimate of a voltage of the at least one battery cell if a second constant current were flowing through the battery cell throughout the time period, where the second constant current is different to the first current.

22 Claims, 9 Drawing Sheets

(51) Int. Cl.
    *G01R 31/3835*     (2019.01)
    *G01R 31/3842*     (2019.01)
    *H01M 10/42*     (2006.01)
    *H01M 10/48*     (2006.01)
    *G01R 31/389*     (2019.01)

(52) U.S. Cl.
    CPC ........ *G01R 31/392* (2019.01); *H01M 10/425* (2013.01); *H01M 10/48* (2013.01); *H02J 7/005* (2020.01); *G01R 31/389* (2019.01); *H01M 2010/4271* (2013.01); *H01M 2220/20* (2013.01)

(56) References Cited

U.S. PATENT DOCUMENTS

| | | |
|---|---|---|
| 2006/0022677 A1 | 2/2006 | Patino |
| 2012/0072144 A1 | 3/2012 | Zhang et al. |
| 2015/0226807 A1 | 8/2015 | Aumentado et al. |

\* cited by examiner

BATTERY MANAGEMENT SYSTEM AND METHOD

CROSS-REFERENCE TO RELATED APPLICATIONS

This application is a national-stage filing under 37 USC 371(c) of International Application No. PCT/GB2019/051448, file May 28, 2019, which claims priority to, and the benefit of, GB1809377.3, filed Jun. 7, 2018, the entire contents of each of which are herein incorporated by reference in their entirety for all purposes.

FIELD OF THE INVENTION

The present disclosure relates to apparatus and methods for use in a battery comprising at least one battery cell. The apparatus and methods may find particular application in the field of batteries comprising a lithium sulphur battery cell. The apparatus and methods may additionally or alternatively find application in the field of batteries comprising a nickel metal hydride battery cell and/or a lithium ion battery cell.

BACKGROUND

Rechargeable batteries typically include a plurality of rechargeable battery cells which are designed to undergo successive charge-discharge cycles. The use of such rechargeable batteries, for the purposes of charging them with stored electrochemical energy for later discharge and use, is gaining increasing importance in a range of applications. Such applications may, for example, include automotive, marine and other vehicle applications, domestic and uninterruptable energy supplies, and storage of energy produced from intermittent and renewable electricity sources for demand and load levelling in domestic and grid-tied power networks.

A typical battery cell comprises an anode, a cathode and an electrolyte disposed between the anode and cathode. The anode, cathode and electrolyte may be contained within a housing, for example, a pouch. Electrical connections, for example, connection tabs may be coupled to the housing to provide electrical connection with the anode and cathode of the cell.

A particular type of battery cell which is contemplated herein is a lithium sulphur (Li—S) battery cell. Lithium sulphur is a next generation cell chemistry that, having a theoretical energy density 5 times greater than, for example, lithium ion, may better serve as an electrochemical energy store for a range of applications. A typical lithium-sulphur cell comprises an anode formed from lithium metal or a lithium metal alloy, and a cathode formed from elemental sulphur or other electroactive sulphur material. The sulphur or other electroactive sulphur-containing material may be mixed with an electrically conductive material, such as carbon, to improve its electrical conductivity.

Also contemplated herein are other battery cell chemistries such as nickel metal hydride battery cells and/or lithium ion based battery cell chemistries. Examples of suitable lithium ion based battery cell chemistries include lithium iron phosphate (LFP) graphite battery cells and/or lithium nickel cobalt aluminium (NCA) battery cells.

During charge and/or discharge of a battery cell it may be desirable to determine one or more properties of the cell such as the state of charge and/or a state of health of the battery cell.

It is in this context that the subject matter contained in the present application has been devised.

SUMMARY OF THE INVENTION

According to a first aspect of the invention there is provided a battery management system for determining a time series of normalised voltage of at least one battery cell corresponding to a time period during which a first current flows through the at least one battery cell, the battery management system comprising: a cell monitoring device configured to measure a current flowing through the at least one battery cell and a voltage of the at least one battery cell at a plurality of different times during the time period; and a controller configured to determine a normalised voltage of the at least one battery cell for each of the plurality of different times, in dependence on the measured current and measured voltage corresponding to that time, wherein the determined normalised voltages at the plurality of different times form a times series of normalised voltage, wherein the normalised voltage at each of the plurality of different times corresponds to an estimate of a voltage of the at least one battery cell if a second constant current were flowing through the battery cell throughout the time period, where the second constant current is different to the first current.

The first current may vary with time during the time period. Alternatively, the first current may remain substantially constant during the time period. In embodiments in which the first current is substantially constant during the time period, the first constant current is different to the second constant current. In embodiments in which the first current varies with time during the time period, the second current is different to the first current for at least some of the time period.

The determined normalised voltage corresponds to an estimate of the voltage of the at least one battery cell if a second current were flowing through the at least one battery cell, which is different to the measured current which actually flows through the at least one battery cell during the time period. The normalised voltage therefore provides a measure of the voltage of the cell which is independent of the current flowing through the battery cell during the time period. This may allow the normalised voltage to be compared, for example, to reference voltage data and/or to voltages measured during different charge and/or discharge cycles of at least one battery cell (e.g. when a different current flows through the at least one battery cell). This may, for example, allow the normalised voltage to be used to determine the state of charge and/or a measure of the state of health of the at least one battery cell.

The second constant current may represent a non-zero current. A non-zero current is a current having a magnitude of greater than zero. For example, the second current may be a small finite non-zero current. That is, the normalised voltage may correspond to an estimate of a voltage of the at least one battery cell if a small non-zero current were flowing through the battery cell throughout the time period. In general, the second constant current may be a current at which the at least one battery cell exhibits a voltage, which varies as a function of state of charge. This may allow the normalised voltage to be used to determine or estimate the state of charge of the at least one battery cell.

Determining a normalised voltage which corresponds to an estimate of a voltage of the at least one battery cell if a non-zero current were flowing through the battery cell throughout the time period, may be particularly advantageous, for example, in embodiments in which the at least one battery cell comprises a lithium sulphur battery cell. As will be described in further detail below, a lithium sulphur battery cell may exhibit an open cell voltage, which is substantially invariant to the state of charge of the battery cell. However, the voltage of a lithium sulphur battery cell whilst a small finite current flows through the battery cell, is a function of the state of charge of the battery cell and may be used to determine the state of charge of the battery cell.

In other embodiments, the second current may, for example, be approximately zero. That is, in some embodiments, the normalised voltage may comprise an estimate of the open cell voltage of the at least one battery cell. Some battery cells (e.g. lithium ion battery cells) exhibit an open cell voltage which varies as a function of the state of charge of the battery cell. In embodiments in which the open cell voltage of the battery cell is a function of the state of charge of the battery cell, a normalised voltage which comprises an estimate of the open cell voltage of the battery cell may be used to determine the state of charge of the battery cell.

The controller may be further configured to determine a state of charge of the at least one battery cell in dependence on at least one of the determined normalised voltages.

Determining the state of charge of the at least one battery cell may comprise comparing the at least one determined normalised voltage to a reference voltage profile of at least one reference battery cell, wherein the reference voltage profile represents a voltage of the at least one reference battery cell as a function of state of charge.

The reference voltage profile may, for example, correspond to reference measurements made of one or more reference battery cells under controlled conditions and/or computational simulations of a theoretical reference cell. The reference voltage profile may, for example, take the form of one or more lookup tables of a voltage corresponding to one or more states of charge, one or more mathematical functions representing reference cell voltage as a function of state of charge and/or one or more reference data sets indicative of a voltage of a reference cell as a function of state of charge.

The controller may comprise a memory in which reference voltage data is stored. The controller may retrieve one or more reference voltage profiles from the memory in order to compare the at least one normalised voltage to the at least one reference voltage profile.

Comparing the at least one determined normalised voltage to a reference voltage profile may comprise matching the at least one determined normalised voltage to a position in the reference voltage profile.

Matching the at least one determined normalised voltage to a position in the reference voltage profile may comprise determining a feature of interest in the time series of normalised voltage and matching the feature of interest to a position in the reference voltage profile.

A determined feature of interest in the time series of normalised voltage may, for example, comprise, a feature or point of interest which is indicative of a change in reaction state occurring in the at least one battery cell. A change in reaction state may, for example, comprise one or more of a change in reaction mechanism occurring in the at least one battery cell, a change in reaction rate occurring in the at least one battery cell and/or physio-chemical processes such as precipitation and/or dissolution occurring in the at least one battery cell.

The controller may be further configured to: determine an amount of charge transferred to and/or from the at least one battery cell during the time period based on the measurements of the current flowing through the at least one battery cell at the plurality of different times during the time period; and determine a state of charge of the at least one battery cell in dependence on the determined amount of charge transferred to and/or from the at least one battery cell during the time period and in dependence on at least one of the determined normalised voltages.

Determining the state of charge of the at least one battery cell may comprise: estimating the state of charge of the at least one battery cell in dependence on the determined amount of charge transferred to and/or from the at least one battery cell during the time period; comparing the at least one determined normalised voltage to a reference voltage profile of at least one reference battery cell, wherein the reference voltage profile represents a voltage of the at least one reference battery cell as a function of state of charge; and updating the estimated state of charge in dependence on the comparison.

The controller may be further configured to apply a correction to a first determined normalised voltage corresponding to a first time of the plurality of times based on a second determined normalised voltage corresponding to a second time of the plurality of times, wherein the first time corresponds to a time at which the measured current flowing through the at least one battery cell is greater than the measured current flowing through the at least one battery cell at the second time.

In some embodiments, the normalised voltage may be determined within a given tolerance. The tolerance within which a normalised voltage is determined may depend on the current flowing through the at least one battery cell at the time for which the normalised voltage is determined. The tolerance within which a normalised voltage is determined may increase with increasing current flowing through the at least one battery cell. Since normalised voltages may be determined within a smaller tolerance for times at which a smaller current flows through the at least one battery cell, one or more normalised voltages determined for times at which a relatively high current flows through the at least one battery cell may be corrected based on one or more normalised voltages determined for times at which a relatively small current flows through the at least one battery cell.

The controller may be further configured to: compare a first determined state of charge corresponding to the first time to a second determined state of charge corresponding to the second time, wherein the first time is earlier than the second time; determine if the at least one battery cell is charging or discharging between the first time and the second time; and apply a correction to the first determined normalised voltage if it is determined that the at least one battery cell is discharging between the first time and the second time, and that the first determined state of charge is less than the second determined state of charge, or if it is determined that the at least one battery cell is charging between the first time and the second time and that the first determined state of charge is greater than the second determined state of charge.

The controller may be further configured to: estimate a normalisation factor at each of the plurality of different times; and determine a normalised voltage for each of the plurality of different times in dependence on the estimated normalisation factor corresponding to that time.

The normalisation factor may be a function of one or more variable properties. For example, the normalisation factor may be a function of one or more of the state of charge of the at least one battery cell, the temperature of the at least one battery cell, the charge/discharge rate of the at least one battery cell and/or a number of charge/discharge cycles previously undergone by the at least one battery cell. Different values of the normalisation factor may be estimated and used to determine a normalised voltage corresponding to different times.

The normalisation factor may be a property of the at least one battery cell which varies as a function of the state of charge of the at least one battery cell. In some embodiments, the at least one battery cell may be a cell whose resistance changes as a function of the state of charge of the at least one battery cell. The normalisation factor may comprise the resistance of the at least one battery cell. Examples of battery cells whose resistance changes as a function of state of charge include a lithium sulphur battery cell, a nickel metal hydride battery cell and lithium ion battery cells such as a lithium iron phosphate (LFP) graphite battery cell and lithium nickel cobalt aluminium (NCA) battery cells.

In some embodiments, the normalisation factor may comprise a measure of the impedance of the at least one battery cell.

Estimating the normalisation factor of the at least one battery cell at each of the plurality of different times may comprise estimating the normalisation factor from normalisation factor reference data.

The normalisation factor reference data may, for example, be stored in a memory of the controller. The controller may retrieve the normalisation factor reference data from the memory in order to estimate the normalisation factor.

The controller may be further configured to: determine an amount of charge transferred to and/or from the at least one battery cell during the time period based on the measurements of the current flowing through the at least one battery cell at the plurality of different times during the time period; and estimate the normalisation factor from the normalisation factor reference data in dependence on the determined amount of charge transferred to and/or from the at least one battery cell during the time period.

The cell monitoring device may be further configured to: measure a temperature indicative of the temperature of the at least one battery cell; and estimate the normalisation factor from the normalisation factor reference data in dependence on the measured temperature indicative of the temperature of the at least one battery cell.

The controller may be further configured to estimate the normalisation factor from the normalisation factor reference data in dependence on history data associated with a usage history of the at least one battery cell.

The history data may be indicative of a number of charge-discharge cycles which the at least on battery cell has undergone during its lifetime.

The normalisation factor may comprise the resistance of the at least one battery cell.

Determining a normalised voltage for each of the plurality of different times may comprise determining a drop in the voltage of the at least one battery cell, which results from the first current flowing through the at least one battery cell. The drop in voltage may be combined with the measured voltage of the at least one battery cell to arrive at the normalised voltage. The drop in voltage may be determined in dependence on the measured current flowing through the at least one battery cell and the resistance of the at least one battery cell (e.g. by multiplying the measured current by the resistance).

Determining a normalised voltage for each of the plurality of different times may comprise: multiplying the estimated resistance corresponding to that time by the measured current corresponding to that time; and adding the multiple of the estimated resistance and the measured current to the measured voltage corresponding to that time.

According to a second aspect of the invention there is provided a battery management system for at least one battery cell, wherein the battery management system comprises: a cell monitoring device configured to measure a voltage of the at least one battery cell at a plurality of different times during charge and/or discharge of the at least one battery cell; and a controller configured to: determine a voltage time series in dependence on the measured voltages; determine a plurality of rates of change of the voltage with respect to time at different points in the voltage time series; determine a plurality of first averages, wherein each of the plurality of first averages comprises an average of a subset of the plurality of rates of change comprising a first number of consecutive rates of change, wherein the plurality of first averages forms a time series of first averages; and determine a first point of interest in the voltage series by identifying a feature in the times series of first averages, wherein the first point of interest is indicative of a change in reaction state occurring in the at least one battery cell.

In some embodiments, each of the plurality of first averages may comprise a mean of a subset of the plurality of rates of change comprising a first number of consecutive rates of change. In some embodiments, each of the plurality of first averages may comprise a mean of a subset of the plurality of rates of change, which is normalised with respect to a time interval over which the subset of plurality of rates of change extend. For example, a mean of a subset of the plurality of rates of change may be determined and may be divided by a measure of a time interval over which the subset extends. A normalised average, such as a mean divided by a time interval is considered as an embodiment of a first average. That is, in some embodiments, the plurality of first averages may comprise averages which have been normalised, for example, with respect to a time interval corresponding to a subset of rates of change over which the average is taken.

A change in reaction state may, for example, comprise one or more of a change in reaction mechanism occurring in the at least one battery cell, a change in reaction rate occurring in the at least one battery cell and/or physio-chemical processes such as precipitation and/or dissolution occurring in the at least one battery cell.

Determining the first point of interest in the voltage series may comprise identifying a local minimum or local maximum in the time series of first averages.

The controller may be further configured to: determine a plurality of second averages, wherein each of the plurality of second averages comprises an average of a subset of the plurality of rates of change comprising a second number of consecutive rates of change, wherein the second number is different to the first number and wherein the plurality of second averages forms a time series of second averages.

In some embodiments, each of the plurality of second averages may comprise a mean of a subset of the plurality of rates of change comprising a second number of consecutive rates of change. In some embodiments, each of the plurality of second averages may comprise a mean of a subset of the plurality of rates of change, which is normalised with respect to a time interval over which the subset of plurality of rates of change extend. For example, a mean of a subset of the plurality of rates of change may be determined and may be divided by a measure of a time interval over which the subset extends. A normalised average, such as a mean divided by a time interval is considered as an embodiment of a second average. That is, in some embodiments, the plurality of second averages may comprise averages which have been normalised, for example, with respect to a time interval corresponding to a subset of rates of change over which the average is taken.

Determining the first point of interest in the voltage series may comprise identifying a feature in the time series of first averages and identifying a corresponding feature in the time series of second averages.

The identified feature in the time series of first averages and the corresponding feature in the time series of second averages may comprise a local minimum or local maximum in the time series of first and second averages.

The controller may be further configured to: determine a second point of interest in the time series of second averages, wherein the second point of interest is indicative of a change in reaction state occurring in the at least one battery cell.

Determining the second point of interest in the time series of second averages may comprise identifying a local minimum or local maximum in the time series of second averages.

The controller may be further configured to determine a state of charge of the at least one battery cell in dependence on the first point of interest.

In some embodiments, a state of charge of the at least one battery cell may comprise comparing the first point of interest to at least one reference voltage profile. A reference voltage profile may represent a voltage of the at least one reference battery cell as a function of state of charge. The first point of interest may, for example, be matched to a corresponding point of interest in a reference voltage profile in order to determine the state of charge of the at least one battery cell.

The controller may be further configured to determine a measure indicative of the state of health of the at least one battery cell in dependence on the first point of interest.

In some embodiments, a measure indicative of the state of health of the at least one battery cell may be determined by determining a voltage at which the first point of interest occurs. For example, the voltage at which the first point of interest occurs may change as the at least one battery cell ages and may therefore be used as a measure of the state of health of the at least one battery cell.

Determining the plurality of rates of change of the voltage may comprise determining a change in voltage over a constant time interval at different times in the voltage time series.

The battery management system may comprise a battery management system according to the first aspect and the time series of a voltage determined by the controller according to the second aspect may comprise the time series of normalised voltage determined by the controller according to the first aspect.

According to a third aspect of the invention there is provided a battery management system for at least one battery cell, wherein the battery management system comprises: a cell monitoring device configured to measure a voltage of the at least one battery cell at a plurality of different times during charge and/or discharge of the at least one battery cell; and a controller configured to: determine a series of voltages in dependence on the measured voltages; identify at least one portion of the series of voltages in which the voltage undergoes a transition; determine a transition voltage from the voltage series, wherein the transition voltage is associated with the identified at least one portion of the series of voltages in which the voltage undergoes a transition; determine a measure indicative of the state of health of the at least one battery cell in dependence on the transition voltage.

The transition voltage associated with the identified at least one portion of the series of voltages in which the voltage undergoes a transition may vary as the at least one battery cell ages. The transition voltage may therefore be indicative of the age of the at least one battery cell (e.g. how many charge/discharge cycles the at least one battery cell has undergone in its lifetime).

The measure indicative of the state of health of the at least one battery cell may comprise the transition voltage or more comprise some other measure which is dependent on the transition voltage. In some embodiments, the measure indicative of the state of health of the at least one battery cell may be normalised with respect to one or more variables. For example, the measure indicative of the state of health of the at least one battery cell may be normalised with respect to at least one of temperature and/or a charge and/or discharge rate at which the transition voltage occurs.

The identified at least one portion of the series of voltages in which the voltage undergoes a transition may be indicative of a change in reaction state occurring in the at least one battery cell.

A change in reaction state may, for example, comprise one or more of a change in reaction mechanism occurring in the at least one battery cell, a change in reaction rate occurring in the at least one battery cell and/or physio-chemical processes such as precipitation and/or dissolution occurring in the at least one battery cell.

Identifying at least one portion of the series of voltages in which the voltage undergoes a transition may comprise: determining, from the series of voltages, a rate of change of voltage at a plurality of different positions in the series of voltages; identifying at least one portion of the series of voltages in which the determined rate of change of voltage undergoes a transition.

The controller may include a memory and the controller may be configured to store, in the memory, the measure indicative of the state of health of the at least one battery cell determined during a plurality of different charge and/or discharge cycles of the at least one battery cell.

The controller may be further configured to determine a state of health of the at least one battery cell based on a comparison of the measure indicative of the state of health stored for a plurality of different charge and/or discharge cycles of the at least one battery cell.

The controller may, for example, determine a change in the measure indicative of the state of health between two or more charge and/or discharge cycles. For example, the controller determines an amount by which the measure indicative of the state of health changes between different charge and/or discharge cycles. If the determined amount by which the measure indicative of the state of health changes between different charge and/or discharge cycles significantly changes then this may indicate that the at least one battery cell is approaching the end of its useful lifetime. For example, as a cell approaches the end of its useful lifetime a transition voltage which is determined during charging and/or discharging may significantly decrease. Such a decrease may be observed and used to determine that the cell is aged.

A battery management system according to the third aspect may comprise a battery management system according to the first aspect, wherein determining the series of voltages in dependence on the measured voltages may comprise determining a time series of normalised voltage as set out with respect to the first aspect.

According to a fourth aspect of the invention there is provided a battery comprising a battery management system according to any preceding claim and at least one battery cell.

The at least one battery cell may comprise at least one lithium sulphur, lithium ion or nickel metal hydride battery cell.

According to a fifth aspect of the invention there is provided a method for determining a time series of normalised voltage of at least one battery cell corresponding to a time period during which a first current flows through the at least one battery cell, the method comprising: measuring a current flowing through the at least one battery cell and a voltage of the at least one battery cell at a plurality of different times during the time period; and determining a normalised voltage of the at least one battery cell for each of the plurality of different times, in dependence on the measured current and measured voltage corresponding to that time, wherein the determined normalised voltages at the plurality of different times form a times series of normalised voltage, wherein the normalised voltage at each of the plurality of different times corresponds to an estimate of a voltage of the at least one battery cell if a second constant current were flowing through the battery cell throughout the time period, where the second constant current is different to the first current.

The method may further comprise determining a state of charge of the at least one battery cell in dependence on at least one of the determined normalised voltages.

Determining the state of charge of the at least one battery cell may comprise comparing the at least one determined normalised voltage to a reference voltage profile of at least one reference battery cell, wherein the reference voltage profile represents a voltage of the at least one reference battery cell as a function of state of charge.

Comparing the at least one determined normalised voltage to a reference voltage profile may comprise matching the at least one determined normalised voltage to a position in the reference voltage profile.

Matching the at least one determined normalised voltage to a position in the reference voltage profile may comprise determining a feature of interest in the time series of normalised voltage and matching the feature of interest to a position in the reference voltage profile.

The method may further comprise: determining an amount of charge transferred to and/or from the at least one battery cell during the time period based on the measurements of the current flowing through the at least one battery cell at the plurality of different times during the time period; and determining a state of charge of the at least one battery cell in dependence on the determined amount of charge transferred to and/or from the at least one battery cell during the time period and in dependence on at least one of the determined normalised voltages.

Determining the state of charge of the at least one battery cell may comprise: estimating the state of charge of the at least one battery cell in dependence on the determined amount of charge transferred to and/or from the at least one battery cell during the time period; comparing the at least one determined normalised voltage to a reference voltage profile of at least one reference battery cell, wherein the reference voltage profile represents a voltage of the at least one reference battery cell as a function of state of charge; and updating the estimated state of charge in dependence on the comparison.

The method may further comprise applying a correction to a first determined normalised voltage corresponding to a first time of the plurality of times based on a second determined normalised voltage corresponding to a second time of the plurality of times, wherein the first time corresponds to a time at which the measured current flowing through the at least one battery cell is greater than the measured current flowing through the at least one battery cell at the second time.

The method may further comprise: comparing a first determined state of charge corresponding to the first time to a second determined state of charge corresponding to the second time, wherein the first time is earlier than the second time; determining if the at least one battery cell is charging or discharging between the first time and the second time; applying a correction to the first determined normalised voltage if it is determined that the at least one battery cell is discharging between the first time and the second time, and that the first determined state of charge is less than the second determined state of charge, or if it is determined that the at least one battery cell is charging between the first time and the second time and that the first determined state of charge is greater than the second determined state of charge.

The method may further comprise: estimating a normalisation factor at each of the plurality of different times; and determining a normalised voltage for each of the plurality of different times in dependence on the estimated normalisation factor corresponding to that time.

Estimating the normalisation factor of the at least one battery cell at each of the plurality of different times may comprise estimating the normalisation factor from normalisation factor reference data.

The method may further comprise: determining an amount of charge transferred to and/or from the at least one battery cell during the time period based on the measurements of the current flowing through the at least one battery cell at the plurality of different times during the time period; and estimating the normalisation factor from the normalisation factor reference data in dependence on the determined amount of charge transferred to and/or from the at least one battery cell during the time period.

The method may further comprise: measuring a temperature indicative of the temperature of the at least one battery cell; and estimating the normalisation factor from the normalisation factor reference data in dependence on the measured temperature indicative of the temperature of the at least one battery cell.

The method may further comprise estimating the normalisation factor from the normalisation factor reference data in dependence on history data associated with a usage history of the at least one battery cell.

The history data may be indicative of a number of charge-discharge cycles which the at least on battery cell has undergone during its lifetime.

The normalisation factor may comprise the resistance of the at least one battery cell.

Determining a normalised voltage for each of the plurality of different times may comprise: multiplying the estimated resistance corresponding to that time by the measured current corresponding to that time; and adding the multiple of the estimated resistance and the measured current to the measured voltage corresponding to that time.

According to a sixth aspect of the invention there is provided a method of determining a point of interest in a voltage series associated with at least one battery cell, wherein the method comprises: measuring a voltage of the at least one battery cell at a plurality of different times during charge and/or discharge of the at least one battery cell; determining a voltage time series in dependence on the measured voltages; determining a plurality of rates of change of the voltage with respect to time at different points in the voltage time series; determining a plurality of first averages, wherein each of the plurality of first averages comprises an average of a subset of the plurality of rates of change comprising a first number of consecutive rates of change, wherein the plurality of first averages forms a time series of first averages; and determining a first point of interest in the voltage series by identifying a feature in the times series of first averages, wherein the first point of interest is indicative of a change in reaction state occurring in the at least one battery cell.

Determining the first point of interest in the voltage series may comprise identifying a local minimum or local maximum in the time series of first averages.

The method may further comprise: determining a plurality of second averages, wherein each of the plurality of second averages comprises an average of a subset of the plurality of rates of change comprising a second number of consecutive rates of change, wherein the second number is different to the first number and wherein the plurality of second averages forms a time series of second averages.

Determining the first point of interest in the voltage series may comprise identifying a feature in the time series of first averages and identifying a corresponding feature in the time series of second averages.

The identified feature in the time series of first averages and the corresponding feature in the time series of second averages may comprise a local minimum or local maximum in the time series of first and second averages.

The method may further comprise: determining a second point of interest in the time series of second averages, wherein the second point of interest is indicative of a change in reaction state occurring in the at least one battery cell.

Determining the second point of interest in the time series of second averages may comprise identifying a local minimum or local maximum in the time series of second averages.

The method may further comprise determining a state of charge of the at least one battery cell in dependence on the first point of interest.

The method may further comprise determining a measure indicative of the state of health of the at least one battery cell in dependence on the first point of interest.

Determining the plurality of rates of change of the voltage comprises determining a change in voltage over a constant time interval at different times in the voltage time series.

Determining a voltage time series in dependence on the measured voltages may comprise determining a time series of normalised voltages according to the method of the fifth aspect.

According to a seventh aspect of the invention there is provided a method of determining a measure indicative of the state of health of at least one battery cell, wherein the method comprises: measuring a voltage of the at least one battery cell at a plurality of different times during charge and/or discharge of the at least one battery cell; determining a series of voltages in dependence on the measured voltages; identifying at least one portion of the series of voltages in which the voltage undergoes a transition; determining a transition voltage from the voltage series, wherein the transition voltage is associated with the identified at least one portion of the series of voltages in which the voltage undergoes a transition; and determining a measure indicative of the state of health of the at least one battery cell in dependence on the transition voltage.

The identified at least one portion of the series of voltages in which the voltage undergoes a transition may be indicative of a change in reaction state occurring in the at least one battery cell.

Identifying at least one portion of the series of voltages in which the voltage undergoes a transition may comprise: determining, from the series of voltages, a rate of change of voltage at a plurality of different positions in the series of voltages; identifying at least one portion of the series of voltages in which the determined rate of change of voltage undergoes a transition.

The method may further comprise storing, in a memory, the measure indicative of the state of health of the at least one battery cell determined during a plurality of different charge and/or discharge cycles of the at least one battery cell.

The method may further comprise determining a state of health of the at least one battery cell based on a comparison of the measure indicative of the state of health stored for a plurality of different charge and/or discharge cycles of the at least one battery cell.

Determining a series of voltages in dependence on the measured voltages may comprise determining a time series of normalised voltages according to the method of the fourth aspect.

The at least one battery cell may comprise at least one lithium sulphur, lithium ion or nickel metal hydride battery cell.

According to an eighth aspect of the invention there is provided computer software which, when executed by a computer, is arranged to perform a method according to any of the fifth, sixth or seventh aspects; optionally the computer software is stored on a computer readable medium.

The computer readable medium may comprise a non-transitory computer readable medium Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF FIGURES

One or more embodiments of the invention are shown schematically, by way of example only, in the accompanying drawings, in which.

DETAILED DESCRIPTION

Before particular examples of the present invention are described, it is to be understood that the present disclosure is not limited to the particular battery management system, battery or method described herein. It is also to be understood that the terminology used herein is used for describing particular examples only and is not intended to limit the scope of the claims.

In describing and claiming the battery management systems, batteries and methods of the present invention, the following terminology will be used: the singular forms "a", "an", and "the" include plural forms unless the context clearly dictates otherwise. Thus, for example, reference to "a battery cell" includes reference to one or more of such elements.

Figure 1:
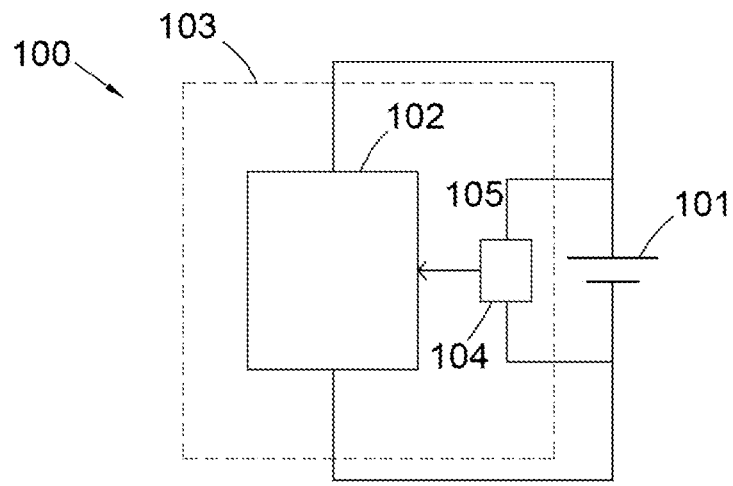
FIG. 1 is a schematic illustration of a battery according to an embodiment of the present invention.

FIG. 1 is a schematic illustration of a battery 100 according to an embodiment of the present invention. The battery 100 comprises a battery cell 101 and a battery management system 103. The battery management system 103 includes a cell monitoring device 104 and a controller 102.

The cell monitoring device 104 is arranged to measure at least one property of the battery cell 101. The cell monitoring device 104 may be arranged to measure a current flowing through the battery cell 101. The cell monitoring device 104 may be arranged to measure a voltage of the battery cell 101. In some embodiments, the cell monitoring device 104 may be arranged to measure a temperature indicative of the temperature of the battery cell 101.

The cell monitoring device 104 provides an input 105 to the controller 102. The input 105 may, for example, represent measurements made by the cell monitoring device 104. For example, the input 105 may comprise data representing one or more measurements of current, voltage and/or temperature made by the cell monitoring device 104. As will be described in further detail below, the controller 102 may determine one or more variables based on the input 105. For example, the controller 102 may be arranged to determine a time series of normalised voltage of the battery cell 101 based on the input 105, a state of charge of the battery cell 101 and/or a measure indicative of a state of health of the battery cell 101.

A battery cell 101 included in a battery 100 according to embodiments of the invention comprises a rechargeable battery cell 101. That is, the battery cell 101 may be operable to undergo successive charge and discharge cycles. During both charge and discharge cycles it is generally desirable to determine a measure of the state of charge of the cell 101 so as to provide a measure of the amount of charge remaining for discharge to a load and/or the extent of progress of a charging cycle.

According to embodiments of the invention the battery cell 101 may comprise a lithium sulphur battery cell. For the purposes of this description, a battery 100 comprising one or more lithium sulphur battery cells 101 may be referred to as a lithium sulphur battery 100.

Whilst embodiments are described herein with reference to lithium sulphur battery cells, the methods and apparatus described herein may additionally or alternatively be used in embodiments including one or more battery cells other than a lithium sulphur battery cell. For example, in some embodiments one or more lithium ion battery cells may be used. Examples of suitable lithium ion battery cells include lithium iron phosphate (LFP) graphite battery cells and/or lithium nickel cobalt aluminium (NCA) battery cells. Other suitable battery cell chemistries include nickel metal hydride battery cells.

Figure 2:
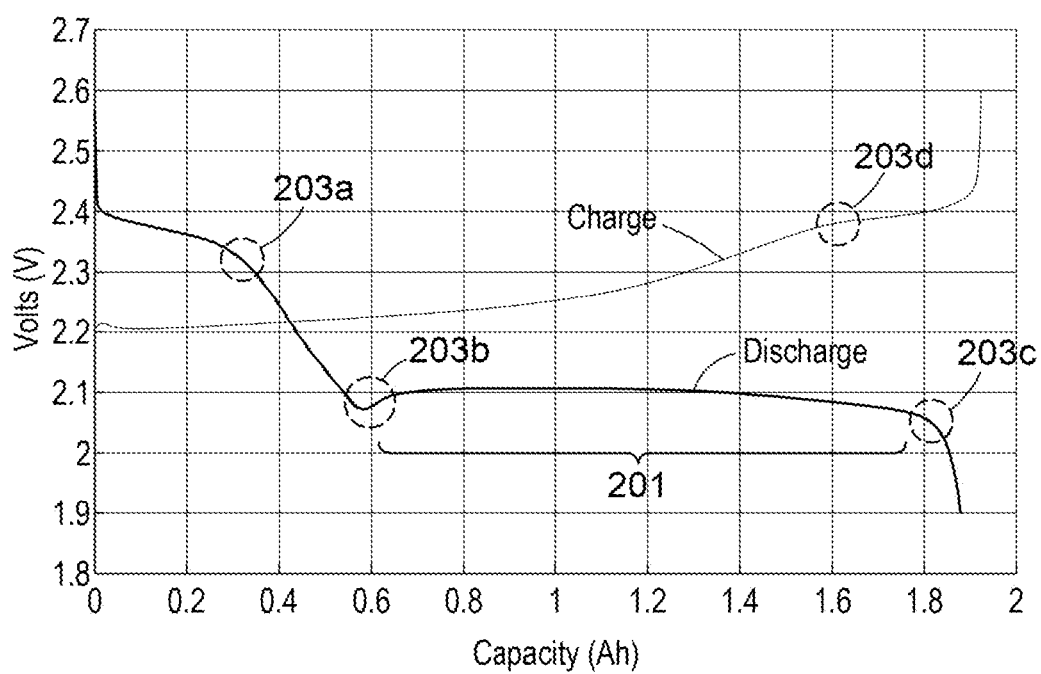
FIG. 2 is a schematic representation of the voltage of a lithium sulphur battery cell during a constant current charge and discharge.

FIG. 2 is a schematic representation of the voltage (V) of a typical lithium sulphur battery cell 101 during a constant current charge and a constant current discharge cycle. The voltage is shown as a function of the cell 101 capacity (i.e. a measure of the amount of charge currently held by the cell) during charge and discharge. In some situations, it may be possible to determine the state of charge of the cell 101 based on a measurement of the voltage of the cell 101. However, as can be seen in FIG. 2, there are typically significant parts of a charge and discharge profile of a lithium sulphur battery cell during which the voltage of the cell is not a strong function of the capacity. For example, the discharge profile of a lithium sulphur battery cell typically includes a central plateau region 201 during which the voltage remains relatively constant throughout significant changes in the capacity of the cell. It may therefore be difficult to directly convert a measurement of the voltage of a lithium sulphur battery cell into a determination of the state of charge of the cell, since there may exist a number of different states of charge which correspond to a similar voltage of the battery cell 101.

As will be described in further detail below, one or more properties of a lithium sulphur battery cell 101 may be determined by taking measurements of the voltage of the cell at different times during charging or discharging. For example, a time series of the voltage of the battery cell may be measured and points of interest in the time series may be identified in order to determine one or more properties (e.g. a state of charge and/or state of health) of the cell. Such methods typically include some form of comparison between measurements of the voltage of the battery cell with some form of reference data. For example, a measured time series of a battery cell may be compared to a reference discharge or charge voltage profile (such as those shown in FIG. 2), in order to derive an approximation of the position of the cell on the reference voltage profile and thus the state of charge of the cell.

Reference data (such as reference discharge and charge voltage profiles), to which a measured time series might be compared, are typically based on the voltage of a cell during constant current charging and/or discharging of the cell. For example, the charge and discharge profiles shown in FIG. 2 represent the voltage of a lithium sulphur cell during constant current charging and constant current discharging. That is, the charge and discharge profiles are based on delivering a constant charging current to the cell and drawing a constant discharge current from the cell respectively. In practice, if the current flowing through a cell varies during charge or discharge then this will introduce changes into a measured time series of the cell voltage and thus may complicate any methods used to determine one or more properties of the cell based on the measured time series.

Under some charging regimes, a battery cell may be charged using a constant charging current and thus a measured time series of cell voltage during charging may be compared directly to reference measurements. However, a typical discharge cycle of a battery cell may include variations in the discharge current flowing from the cell. For example, a cell may be discharged to a variable load which draws a varying current from the cell. For instance, a battery may be used to propel a vehicle (such as a land-going vehicle or an aircraft). The current which is drawn from the battery cell may depend on the required propulsion of the vehicle. For example, relatively high currents may be drawn from the battery cell in order to accelerate the vehicle (e.g. during take-off of an aircraft) and relatively low currents may be drawn from the battery cell during coasting and/or deceleration of the vehicle or when the vehicle is stationary. Furthermore, periods of discharge of the battery cell may be interspersed with periods of charging of the battery cell (e.g. through regenerative braking of the vehicle).

Figure 3A:
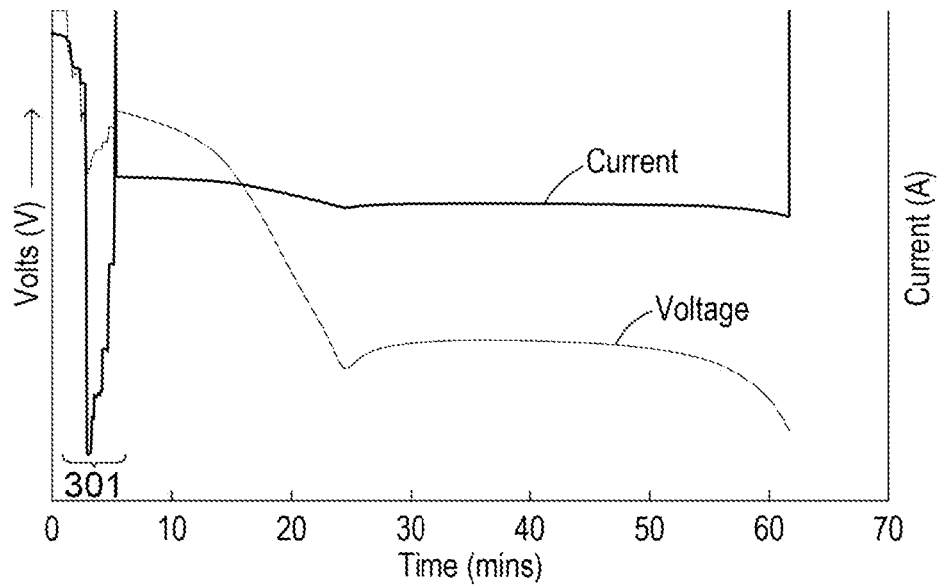
FIG. 3A is a schematic representation of the voltage of a lithium sulphur battery cell as a function of time during a variable load drive cycle.
Figure 3B:
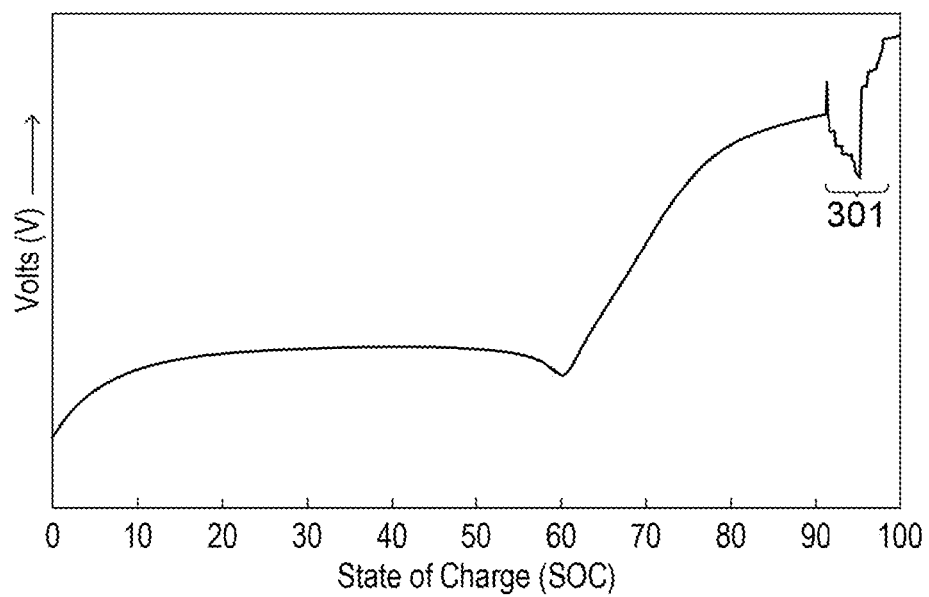
FIG. 3B is a schematic representation of the voltage of a lithium sulphur battery cell as a function of state of charge during the same variable load drive cycle as represented in FIG. 3A.
Figure 3C:
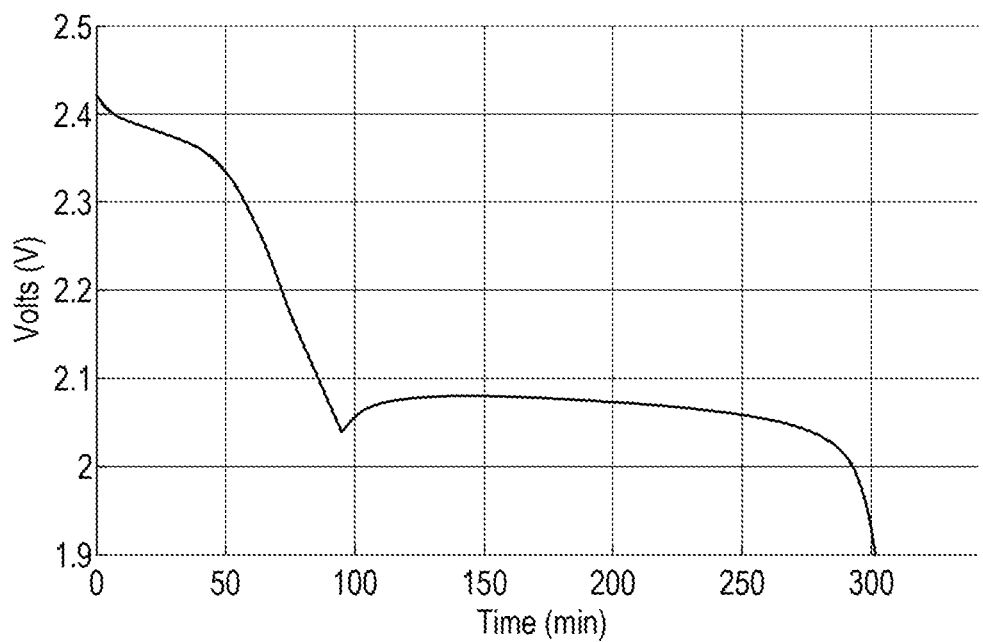
FIG. 3C is a schematic representation of the voltage of a lithium sulphur battery cell as a function of time during a constant current discharge.
Figure 3D:
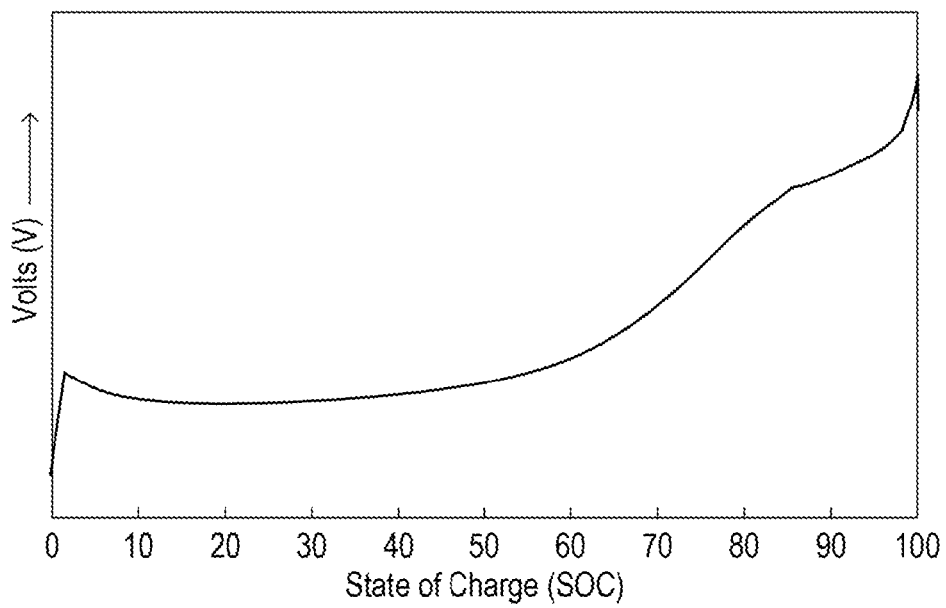
FIG. 3D is a schematic representation of the voltage of a lithium sulphur battery cell as a function of state of charge during a constant current charge of the battery cell.

FIG. 3A is a schematic representation of the voltage of a lithium sulphur battery cell, as a function of time, during a drive cycle of the battery cell. FIG. 3B is a schematic representation of the voltage of the same lithium sulphur battery cell during the same drive cycle as shown in FIG. 3A but represented as a function of state of charge (SOC) rather than as a function of time. For comparison, FIG. 3C is a schematic representation of the voltage of a lithium sulphur battery cell, as a function of time, during a constant current discharge cycle at a rate of 0.2 C. FIG. 3D is a schematic representation of the voltage of the same lithium sulphur battery cell during a constant current charge cycle represented as a function of state of charge (SOC).

FIG. 3A also includes a representation of the discharge current which is drawn from the battery as a function of time. The drive cycle shown in FIG. 3A includes a period labelled 301 during which a variable discharge current is drawn from the battery cell. For the majority of the remainder of the time period shown in FIG. 3A a substantially constant discharge current is drawn from the battery cell.

As can be seen by comparing FIGS. 3A and 3C, variations in the charge/discharge current of the cell in the time period labelled 301 introduces variations, and in some cases discontinuities, in the time series of measured voltage (when compared to the voltage time series corresponding to a constant discharge current shown in FIG. 3A). In other examples, periods of discharge of a battery cells may be interspersed with one or more periods during which a charging current is delivered to the battery cell (e.g. during regenerative braking of a vehicle), which may introduce further variations and/or discontinuities into a time series of measured voltage. It may therefore be difficult to determine one or more properties of a battery cell (such as a state of charge and/or state of health of the cell) from a time series of voltage measurements over a time period during which a current flowing through the battery cell varies with time.

According to embodiments of the invention a time series of normalised voltage of a battery cell may be determined for a time period during which a current flowing through the battery cell varies with time. The normalised voltage of the battery cell may correspond to an estimate of the equivalent voltage of the battery cell if a constant current were flowing through the battery cell throughout the time period. The constant current for which the normalised voltage is estimated is different to the current which actually flows through the battery cell during the time period.

In general, the constant current for which the normalised voltage is estimated is a current at which the voltage of the battery cell varies as a function of state of charge. This allows information about the state of charge of the cell to be derived from the determined normalised voltage. In the particular example of a lithium sulphur battery cell, when no current flows through the battery cell (e.g. no load is connected across the battery cell), the voltage of the lithium sulphur battery cell tends to a nominal voltage which is substantially invariant to the state of charge of the battery cell.

In a lithium sulphur battery cell, sulphur is reduced to a number of different species which reach different levels of equilibrium with each other at different states of charge. When a current flows through the cell, the different levels of equilibrium at different states of charge causes the voltage of the cell to vary as a function of state of charge. However, when no current flows through the cell (i.e. the cell is placed in open circuit), interconversion of species in the electrolyte allows ions in the cell to rearrange into an equilibrium, which results in an open cell voltage of approximately 2.15 V irrespective of the state of charge of the cell.

The constant current charge and discharge voltage profiles shown in FIGS. 2, 3C and 3D represent the voltage of a lithium sulphur cell when a small finite constant current is drawn from or provided to the lithium sulphur cell. Consequently, the voltage of the cell varies as a function of state of charge as can be seen in FIGS. 2, 3C and 3D.

For embodiments in which the battery cell is a lithium sulphur battery cell, a normalised voltage may be determined which corresponds to an estimate of a voltage of the battery cell if a non-zero constant current were flowing through the battery cell. A non-zero current is a current having a magnitude which is greater than zero. For example, the constant current for which a normalised voltage is determined may be a small finite non-zero current. The constant current for which a normalised voltage is determined may, for example, be approximately the same as a constant current for which a reference voltage profile of a battery cell is known. For example, a normalised voltage may be determined corresponding to the same constant current which was used to derive the charge and discharge voltage profiles shown in FIGS. 2, 3C and 3D.

For battery chemistries other than lithium sulphur, the open cell voltage of a battery cell may vary as a function of the state of charge of the cell. For example, the open cell voltage of a lithium ion battery generally varies as a function of state of charge in a similar manner to the voltage of a lithium ion cell during a low current charge and/or discharge of the cell. The open cell voltage of a cell may therefore be used to determine the state of charge of the cell.

In embodiments in which the open cell voltage of a battery cell varies as a function of state of charge (e.g. for a lithium ion battery cell), a normalised voltage may be determined which corresponds to an estimate of the equivalent voltage of the battery cell if zero current were flowing through the battery cell throughout the time period. That is, the normalised voltage may correspond to an estimation of the open cell voltage of the battery cell throughout the time period.

Determining a normalised voltage of a battery cell may allow comparison with, for example, a reference normalised voltage (e.g. to determine one or more properties such as a measure of the state of charge and/or state of health of the cell) even for time periods during which a variable current flows through the cell.

Whilst situations are contemplated herein in which a normalised voltage is determined for time periods during which a variable current flows through a battery cell, it may additionally or alternatively be useful to determine a normalised voltage for time periods during which a substantially constant current flows through a battery cell. In general, a normalised voltage may be determined for a time period during which a first current flows through a battery cell. The first current may vary with time during the time period or may be substantially constant throughout the time period. A normalised voltage may be determined for a plurality of different times during the time period, where the normalised voltage corresponds to an estimate of the voltage of the battery cell if a second current were flowing through the battery cell throughout the time period. The second current is a constant current. That is, the same second current may be used to estimate a normalised voltage at each time throughout the time period. The second current is different to the first current. That is, a normalised voltage is determined which corresponds to an estimate of the voltage of the battery cell if a current were flowing through the battery cell which is different to a measured current which actually flows through the battery cell during the time period.

Determining a series of normalised voltages for a time period during which a substantially constant current flows through a battery cell may allow the normalised voltage to be compared, for example, to reference voltage data. The reference voltage data may represent a voltage of a battery cell for a time period during which a different constant current flows through the battery cell. For example, the reference voltage data could represent the open cell voltage of a battery cell (e.g. for battery cells whose open cell voltage varies as a function of state of charge) at different points during charge and/or discharge of a cell. In some embodiments, the reference voltage data could represent the voltage of a battery cell at different points during a charge and/or discharge of a cell carried out by passing a small finite current through the cell.

A normalised voltage may be determined in dependence on a measured current flowing through a cell. Additionally or alternatively a normalised voltage may be determined in dependence on a measured voltage of the cell. In some embodiments a time series of normalised voltage may be determined. The cell monitoring device 104 may measure a current flowing through the cell 101 and a voltage of the cell 101 at a plurality of different times during a given time period. The given time period may be a time period during which a current flowing through the cell varies with time (as is the case, for example, in the time period represented in FIG. 3A). Alternatively, the given time period may be a time period during which a current flowing through the cell is substantially constant with time (as is the case, for example, in the time period represented in FIG. 3C). The controller 102 may determine a normalised voltage of the battery cell 101 for each of the plurality of different times at which the voltage and current are measured. The determined normalised voltage at the plurality of different times forms a time series of normalised voltage.

The normalised voltage is determined in dependence on a normalisation factor, which is used to convert a measured current and voltage to a normalised voltage. In some embodiments, the normalisation factor may comprise the resistance of the cell 101 for which the normalisation voltage is determined. In other embodiments, the normalisation factor may more generally comprise a measure of the impedance of the cell 101 for which the normalisation voltage is determined.

In some embodiments, a normalised voltage $V_{norm}(SOC)$ may be determined at a given state of charge (SOC) of the cell according to equation (1):

$$V_{norm}(SOC)=V_{meas}(SOC)+I_{meas}(SOC)*R(SOC,T,C,LC,x) \quad (1)$$

where $V_{meas}(SOC)$ is the measured voltage of the cell 101 at the given state of charge (SOC), $I_{meas}(SOC)$ is the measured current flowing through the cell 101 at the given state of charge and $R(SOC, T, C, LC, x)$ is the resistance of the cell 101 at the given state of charge. The resistance R is shown as being a function of the state of charge (SOC), the temperature T of the cell, the charge/discharge rate C of cell, the number of charge/discharge cycles LC previously undergone by the cell and other factors x which may influence the resistance of the cell.

Figure 4:
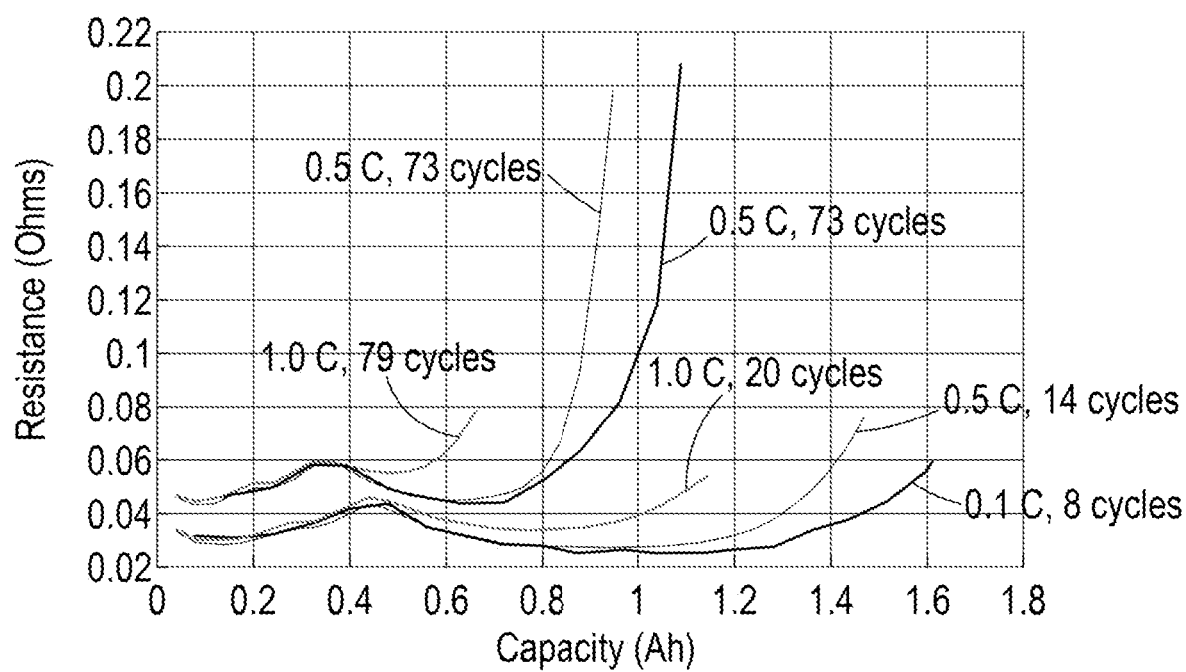
FIG. 4 is a schematic representation of the resistance of a lithium sulphur battery cell as a function of capacity at various stages of the cell's lifetime.

FIG. 4 is a schematic representation of the resistance of a lithium sulphur battery cell as a function of capacity of the cells during discharge at various different stages in the lifetime of the cell. The capacity of a cell during discharge provides an approximate indication of the state of charge (SOC) of the battery. However, the maximum capacity of a cell may differ depending on the age of the cell and/or on the discharge rate with which the cell is discharged. For example, the maximum state of charge of the cell (or top of charge) may be reached at a lower capacity, for aged cells which have undergone a relatively large number of previous charge/discharge cycles.

The resistance as a function of capacity is shown in FIG. 4 for different charging cycles of the cell after the cell has undergone different numbers of charge/discharge cycles LC and which are carried out at different discharge rates C. Each resistance profile shown in FIG. 4 is provided with a label in which the discharge rate C at which the cell is being discharged, is indicated first, followed by a number of charge/discharge cycles LC which the cell has previously undergone.

As can be seen in FIG. 4, the resistance of the cell represented in FIG. 4 initially increases during discharge, before decreasing slightly and then increasing again near to the top of charge. In general, the resistance at a given capacity tends to be larger when the cell has previously undergone a larger number of charge/discharge cycles LC and tends to be larger for higher discharge rates C (for batteries of approximately the same age).

As indicated in equation (1) the resistance of a cell may also depend on the temperature T. For example, the resistance of a cell may in general decrease with increases in temperature. The resistance of a battery cell may additionally or alternatively be at least partially dependent on one or more other factors not explicitly described herein.

In order to determine a normalised voltage $V_{norm}$ of a battery cell, the resistance of the cell may be estimated and the normalised voltage $V_{norm}$ may be determined in dependence on the estimated resistance. For example, a normalised voltage $V_{norm}$ may be determined by multiplying the estimated resistance by a measured current and adding the multiple of the estimated resistance and the measured current to a measured voltage, as set out in equation (1). A resistance of the cell may be estimated for each of a plurality of different times at which a current and voltage of the cell are measured. A normalised voltage $V_{norm}$ may then be determined for each of the plurality of times, using the measured current, measured voltage and estimated resistance corresponding to that time.

The resistance of a battery cell may, for example, be estimated from reference resistance data. The reference resistance data may comprise data indicative of the resistance of a battery cell as a function of one or more properties of the cell, such as the temperature of the cell, the charge/discharge rate of the cell, the state of charge or capacity of the cell, a history of the cell (e.g. a number of charge-discharge cycles which the cell has undergone during its lifetime) and any other factor on which the resistance may depend. The reference resistance data may, for example, take the form of one or more lookup tables of cell resistance, one or more mathematical functions representing cell resistance and/or one or more reference data sets indicative of cell resistance. The reference resistance data may, for example, be generated based on reference measurements of one or more reference cells under different conditions and/or on computational simulations of a cell under different conditions.

In some embodiments, the controller 102 may estimate and/or determine one or more properties of the cell on which the cell resistance is dependent and estimate the cell resistance from reference resistance data based on the one or more estimated and/or determined properties of the cell. For example, for a given time of the plurality of times, the controller 102 may estimate and/or determine one or more of: the temperature of the cell, the charge/discharge rate of the cell, the state of charge or capacity of the cell and/or the number of charge/discharge cycles previously undergone by the cell. The controller 102 may then estimate the resistance of the cell based on the one or more estimated and/or determined properties of the cell. For example, the controller 102 may look up a value of cell resistance in a cell resistance lookup table based on the one or more estimated and/or determined properties. Additionally or alternatively, the one or more estimated and/or determined properties may be input to a mathematical function which may output an estimate of the cell resistance based upon the input cell properties.

In embodiments in which the cell resistance is estimated in dependence on a temperature of the cell, a temperature indicative of the temperature of the cell may be measured. For example, the cell monitoring device 104 may be configured to measure a temperature indicative of the temperature of the cell 101 and may provide the measured temperature to the controller 102 as part of the input 105 provided to the controller 102. The controller 102 may then estimate the resistance of the cell 101 from reference resistance data in dependence on the measured temperature.

In embodiments in which the cell resistance is estimated in dependence on a history of the cell, the controller 102 may monitor and/or store history data associated with the cell 101. For example, the controller 102 may monitor and store (e.g. in memory included in the controller 102) a number of charge-discharge cycles which the cell has undergone during its lifetime. The controller 102 may then estimate the resistance of the cell 101 from reference resistance data in dependence on the stored number of charge-discharge cycles which the cell has undergone.

In embodiments in which the cell resistance is estimated in dependence on a charge/discharge rate of the cell 101, the controller 102 may determine the charge/discharge rate of the cell 101 from measurements of the current flowing through the cell 101. For example, as was explained above, the cell monitoring device 104 may measure a current flowing through the cell 101 and may provide an input 105 to the controller 102, which is indicative of the measured current. The controller 102 may determine the charge/discharge rate of the cell 101 from the measured current. The controller 102 may then estimate the resistance of the cell 101 from reference resistance data in dependence on the determined charge/discharge rate of the cell 101.

In embodiments in which the cell resistance is estimated in dependence on the state of charge or capacity of the cell, the state of charge or capacity of the cell may be estimated based on an amount of charge transferred to and/or from the battery cell 101. For example, the controller 102 may be configured to determine an amount of charge delivered to and/or from the cell 101 based on measurements of the current flowing through the cell 101. The amount of charge delivered to and/or from the cell may be determined over a time period following a time at which a state of charge and/or capacity of the cell is known, or at least estimated to a reasonable accuracy. For example, in a situation in which a cell 101 is being discharged from a state of charge close to (or at) a top of charge state, the state of charge of the cell may be known to a reasonable accuracy at the start of the discharge process. Measurements of the current flowing from the cell 101 during the discharge process may then be used to determine an amount of charge transferred from the battery cell following a time at which the cell was at its top of charge state. For example, the measured current may be integrated with respect to time over a time period following a time at which the cell was at its top of charge state.

Determining an amount of charge transferred to and/or from the cell 101 over a given time period may be referred to as coulomb-counting.

A determination of the amount of charge transferred to and/or from the cell 101 over a given time period may be used to estimate the resistance of the cell based on reference resistance data. The amount of charge transferred to and/or from the cell 101 may be used to estimate a state of charge or capacity of the cell 101. For example, during a time period during which the cell 101 discharges from a top of charge state, the amount of charge transferred from the cell 101 since the cell was at the top of charge state may provide an estimate of the state of charge or capacity of the cell. The controller 102 may then estimate the resistance of the cell 101 from reference resistance data in dependence on the estimated state of charge or capacity of the cell 101.

As was explained above, a resistance of the cell 101 may be estimated for each of a plurality of different times at which a current and voltage of the cell are measured. A normalised voltage $V_{norm}$ may then be determined for each of the plurality of times, using the measured current, measured voltage and estimated resistance corresponding to that time. For example, at a plurality of different times a normalised voltage $V_{norm}$ may be determined according to equation (1) using a measured voltage $V_{meas}$, a measured current $I_{meas}$ and an estimated resistance R corresponding to that time. A normalised voltage $V_{norm}$ determined for each of a plurality of different times forms a time series of normalised voltage $V_{norm}$.

As was explained above, a time series of normalised voltage $V_{norm}$ corresponding to a time period (e.g. during which a current flowing through the battery cell 101 varies with time or a time period during which a substantially constant current flows through the battery cell 101), corresponds to an estimate of a voltage of the cell 101 if a constant current were flowing through the cell throughout the time period, where the constant current is different to a current which actually flows through the battery cell during the time period. For example, the normalised voltage $V_{norm}$ may correspond to an estimate of a voltage of the cell 101 if a relatively small constant current (or substantially no current, for embodiments in which the voltage of the battery cell varies as a function of state of charge) were flowing through the cell throughout the time period.

The normalised voltage $V_{norm}$ of the battery cell 101 therefore provides a measure of the cell voltage which is independent of the current flowing through the cell. This allows the normalised voltage $V_{norm}$ to be compared to reference data, for example to determine a measure of the state of charge and/or state of health of the cell. This may be particularly useful, for example, for charge and/or discharge cycles during which the current flowing through a cell 101 is not constant and thus the voltage of the cell 101 is dependent on the current, as well as other factors such as the state of charge. For example, determining a normalised voltage $V_{norm}$ of a cell may find particular (but not exclusive) application for drive cycles during which a battery cell 101 is discharged to a variable load and thus the voltage of the cell undergoes relatively large variations caused by variations in the current provided to the variable load.

Determining a normalised voltage $V_{norm}$ may additionally or alternatively be useful for charge and/or discharge cycles during which a substantially constant current flows through a cell 101. A series of normalised voltage $V_{norm}$ determined for such a time period provides a measure of the cell voltage which is independent of the magnitude of the constant current which flows through the cell 101 during the time period.

Embodiments have been described above in which a normalisation voltage of a lithium sulphur is determined. In other embodiments corresponding methods and/or apparatus may be used to determine a normalised voltage of one or more battery cells other than a lithium sulphur battery cell. For example, corresponding methods and/or apparatus may be used for battery cells whose resistance varies as a function of state of charge, as was explained above with reference to a lithium sulphur battery cell. Examples of such suitable battery cells include lithium ion battery cells such as lithium iron phosphate (LFP) graphite battery cells and/or lithium nickel cobalt aluminium (NCA) battery cells. Other such suitable battery cells include nickel metal hydride battery cells.

Embodiments have been described above in which a normalised voltage is determined in dependence on the resistance of a cell. In other embodiments one or more other normalisation factors (other than resistance) may be used to determine a normalised voltage of a cell. For example, a normalisation factor which comprises a measure of the impedance of a battery cell may be used to determine a normalised voltage.

A time series of normalised voltage $V_{norm}$ associated with a battery cell may be used to determine the state of charge of the cell. For example, the state of charge of a cell 101 may be determined for a plurality of different times associated with a time series of normalised voltage. In some embodiments, a state of charge of the cell 101 may be determined for each time associated with a time series of normalised voltage.

The state of charge of the cell 101 may be determined, in dependence on a time series of normalised voltage by comparing at least one of the normalised voltages to reference data indicative of one or more reference voltage profiles of a reference battery cell. For example, all or part of a time series of normalised voltage may be compared to a reference voltage profile representing a voltage of a reference battery cell as a function of state of charge of the reference battery cell.

A reference voltage profile may be generated based on reference measurements made of one or more reference battery cells under controlled conditions. Additionally or alternatively, a reference voltage profile may be generated based on computational simulations of a theoretical reference cell. A reference voltage profile may, for example, take the form of one or more lookup tables of a voltage corresponding to one or more states of charge, one or more mathematical functions representing reference cell voltage as a function of state of charge and/or one or more reference data sets indicative of a voltage of a reference cell as a function of state of charge. A reference voltage profile may, for example, be indicative of a constant current voltage of a reference battery cell as a function of the state of charge of the reference battery cell. For example, a reference voltage profile may be indicative of voltage profiles of the type shown in FIG. 2.

In some embodiments, one or more determined normalised voltages may be matched to a position in a reference voltage profile. For example, one or more features in a normalised voltage series may be matched to a position in a reference voltage profile at which a corresponding feature occurs. As can be seen, for example, in FIG. 2, a voltage profile representing the voltage of a lithium sulphur battery cell during a constant current charge and discharge includes a number distinctive features or regions of interest. For example, during both charge and discharge, the voltage profile of the cell includes distinctive features 203a, 203b, 203c, 203d at which the rate of change of voltage undergoes a distinctive change or transition. For example, at the distinctive feature of interest labelled 203b in FIG. 2, the voltage of the cell transitions between a period in which the cell voltage is monotonically decreasing and a period 201 in which the cell voltage is relatively constant. A feature of interest in a voltage profile may, for example, be indicative of a change in reaction state occurring in a battery cell. References herein to a change in reaction state occurring in a battery cell may, for example, refer to one or more of a change in reaction mechanism occurring in the battery cell, a change in reaction rate occurring in the battery cell and/or physio-chemical processes such as precipitation and/or dissolution occurring in the battery cell.

One or more features 203a-203d in a voltage profile may be used as reference points which may be identified in a series of normalised voltage and matched to a position in a reference voltage profile. The position in the reference voltage profile to which the feature is matched may be indicative of the state of charge of the battery cell. For example, one or more features 203a-203d in a voltage profile may be known to occur at approximately a given state of charge of a battery cell. Identifying a feature of interest 203a-203d in a normalised voltage series may allow a position in the normalised voltage series to be matched to a state of charge in a corresponding reference voltage profile, thereby providing an estimate of the state of charge of the cell at a time corresponding to the identified feature 203a-203d.

In some embodiments, a state of charge of a battery cell 101 may be determined for each time of a time series of normalised voltage. For example, a time series of normalised voltage may be converted to a series of normalised voltages in terms of a state of charge of the cell. As was explained above, the state of charge of a battery cell may be determined in dependence on a comparison between a determined normalised voltage of the cell and a reference voltage profile. Additionally or alternatively, the state of charge of the cell may be determined in dependence on a measure of an amount of charge transferred to and/or from the cell.

As was explained above with reference to estimating the resistance of the cell 101, the state of charge of the cell 101 may be estimated based on measure of an amount of charge transferred to and/or from the battery cell 101. For example, the controller 102 may be configured to determine an amount of charge transferred to and/or from the cell 101 based on measurements of the current flowing through the cell 101, which may be referred to as coulomb-counting. The amount of charge delivered to and/or from the cell 101 may be determined over a time period following a time at which a state of charge and/or capacity of the cell is known, or at least estimated to a reasonable accuracy.

In some embodiments, coulomb counting may be used to provide a first estimate of the state of charge of the cell 101. However, a state of charge determined through coulomb counting may suffer from inaccuracies caused, for example, by inefficiencies and energy losses in the cell 101. For example, during discharging of a cell 101, the state of charge of the cell may decrease by a larger amount than is estimated by coulomb counting. Similarly, during charging of the cell 101, the state of charge of the cell may increase by a smaller amount than is estimated by coulomb counting. Discrepancies between a state of charge estimated using coulomb counting and an actual state of charge may depend on a number of factors such as a rate of charge or discharge, temperature of the cell and/or the age of the cell (e.g. the number of charge-discharge cycles previously undergone by the cell).

In some embodiments, one or more estimates of the state of charge of a cell 101 may be updated by comparing the determined normalised voltage of the cell to a reference voltage profile. For example, during charge or discharge of a cell 101 the state of charge of the cell 101 may initially be estimated using coulomb counting. As charge or discharge of the cell 101 continues, the normalised voltage of the cell 101 may then be determined at a plurality of different times during charge or discharge. At least one of the determined normalised voltages may be compared to a reference voltage profile and one or more estimates of state of charge may be updated based on the comparison.

Figure 5:
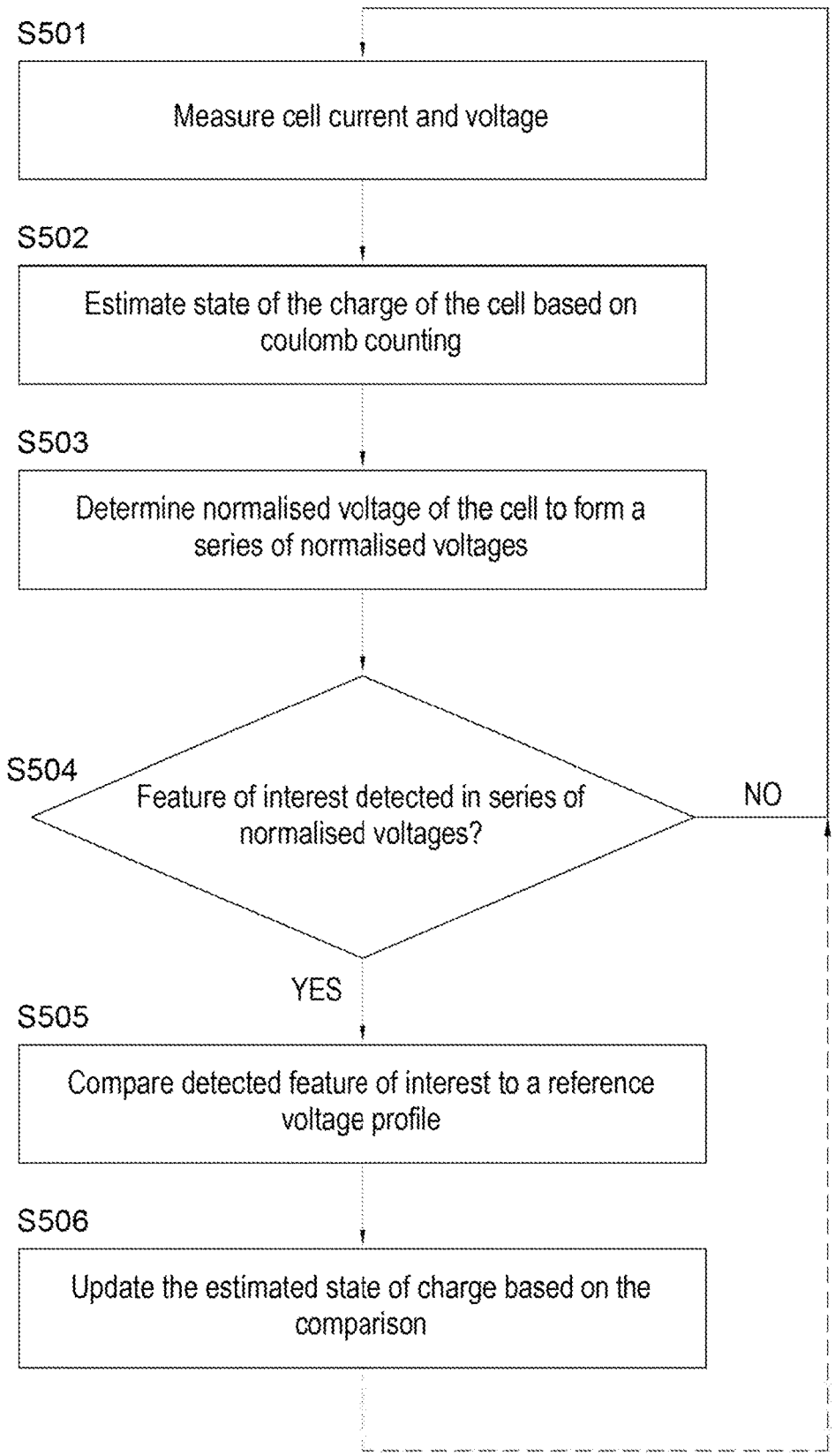
FIG. 5 is a flowchart representing a method of determining the state of charge of a battery cell according to an embodiment of the invention.

FIG. 5 is a flow chart of a method of determining the state of charge of a battery cell 101 according to embodiments of the invention. At step 501 the current flowing through the cell 101 and the voltage of the cell 101 are measured. For example, a cell monitoring device 104 may measure the current flowing through the cell 101 and the voltage of the cell 101.

At step 502 the state of charge of the cell is estimated based on coulomb counting. For example, measurements of the current flowing through the cell 101 may be integrated with respect to time in order to determine an amount of charge which has been transferred to or from the cell 101 over a given time period. The state of charge of the cell 101 may be estimated based on the determined amount of charge which has been transferred to or from the cell 101. For example, the amount of charge which has been transferred to or from the cell 101 since a time at which the state of charge was known or estimated to a reasonable accuracy, may be used to estimate the state of charge based on the known or estimated state of charge at the beginning of the time period.

At step 503 a normalised voltage of the cell is determined, to form a series of normalised voltages. Determining a normalised voltage of a cell 101 was described in detail above and will not be described again with reference to FIG. 5. In some embodiments, the series of normalised voltage may be ordered and/or arranged with respect to the estimated state of charge. For example, a series of normalised voltage as a function of estimated state of charge may be established.

At step 504 it is determined whether or not a feature of interest is detected in the series of normalised voltages. As was explained above, for example with reference to FIG. 2, a normalised voltage series may include one or more distinctive features 203a-203d which may be identified. A feature of interest may, for example, correspond to a point at which a rate of change of the normalised voltage (e.g. with respect to estimated state of charge) undergoes a distinctive change or transition.

If no feature of interest is detected in the series of normalised voltages then the method returns to step 501. The current and voltage of the cell continues to be monitored, the state of charge continues to be estimated and the normalised voltage of the cell continues to be determined until a feature of interest is detected in the series of normalised voltages.

If a feature of interest is detected in the series of normalised voltages, the method continues to step 505. At step 505 the detected feature of interest is compared to one or more reference voltage profiles. For example, the detected feature of interest may be matched to the position of a corresponding feature in a reference voltage profile. In this way, the state of charge of the cell at a time corresponding to a matched feature of interest in the series of normalised voltage may be determined through comparison to a reference voltage profile. At step 506 the states of charge which were estimated at step 502 based on coulomb counting may be updated based on the comparison carried out at step 505. For example, a state of charge determined through comparison of a feature of interest in a series of normalised voltages with a reference voltage profile may be used to update one or more previous estimates of the state of charge based on coulomb counting.

Optionally, the method returns to step 501. That is, the current and voltage of the cell 101 may continue to be measured, the state of charge of the cell may continue to be estimated based on further coulomb counting and further normalised voltages of the cell may be determined until a further feature of interest is detected in the series of normalised voltages.

Figure 6A:
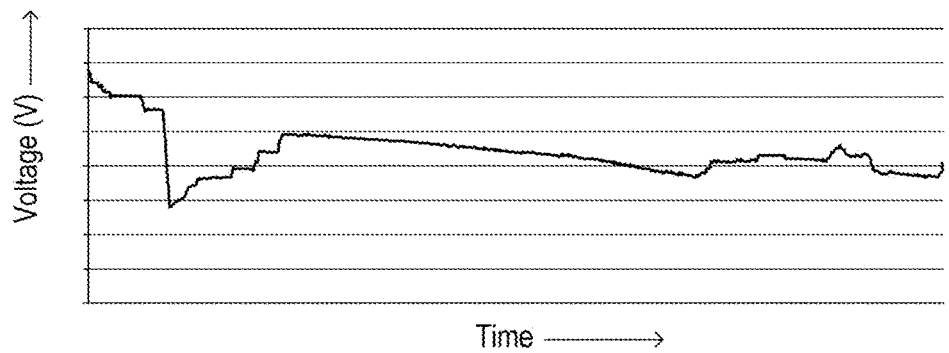
FIG. 6A is a schematic representation of the voltage of a lithium sulphur battery cell during a variable load drive cycle.
Figure 6B:
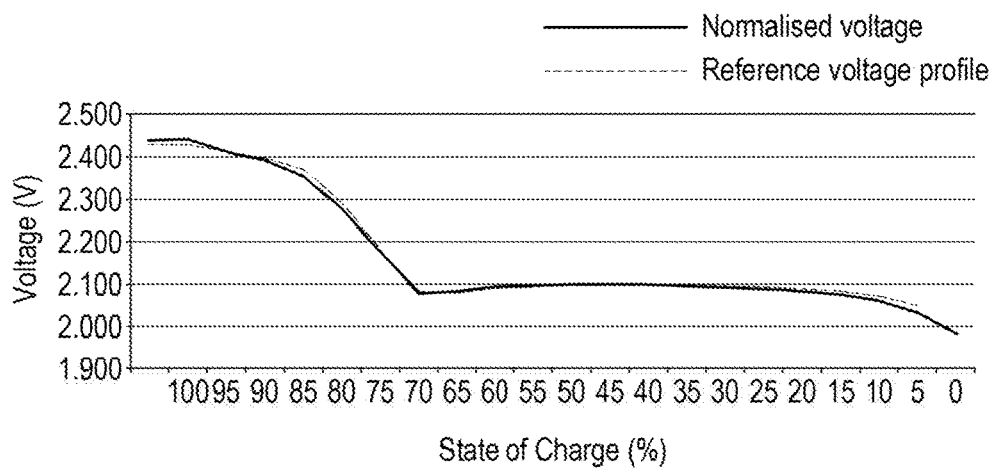
FIG. 6B is a schematic representation of a normalised voltage of the lithium sulphur battery cell determined for the drive cycle represented in FIG. 6A.

It will be appreciated that the techniques and methods described above may be used to determine the normalised voltage of a battery cell as a function of state of charge of the cell throughout a charge or discharge cycle, even when the current flowing through the cell varies during the charge or discharge cycle. An example, of this is illustrated in FIGS. 6A and 6B. FIG. 6A is a schematic representation of the voltage of a lithium sulphur cell as a function of time during a drive cycle, during which a variable current is drawn from the cell. As can be seen in FIG. 6A the voltage of the cell varies with time and includes some discontinuities caused by changes in a current being drawn from the cell. Measurements of the current and voltage of the cell are used to determine a normalised voltage of the cell as a function of state of charge throughout the drive cycle, using the methods described above.

FIG. 6B is a schematic representation of the determined normalised voltage of the cell as a function of state of charge throughout the drive cycle. Also shown in FIG. 6B is a reference voltage profile representing the voltage of a reference cell as a function of state of charge during a constant current discharge. As can be seen in FIG. 6B, the determined normalised voltage closely matches the reference voltage profile. The determined normalised voltage provides a measure of the voltage of the cell which is substantially independent of the current being drawn from the cell and may, for example, be used for cell diagnostics such as determining the state of charge and/or state of health of the cell.

In other embodiments (not illustrated) the techniques and methods described above may be used to determine the normalised voltage of a battery cell as a function of state of charge of the cell throughout a charge or discharge cycle during which a substantially constant current flows through the battery cell.

A normalised voltage of a battery cell may be determined within a given tolerance estimate. The tolerance with which a normalised voltage is determined may depend on the magnitude of the current flowing through the battery cell. In general, the tolerance in the determined normalised voltage increases with increasing current. With reference to equation (1), the contribution of the second term on the right-hand side of equation (1), to the calculated normalised voltage increases with increasing current. The second term on the right-hand side of equation (1) includes the resistance R of the cell. As was explained above, the resistance R may be estimated. The estimation of the resistance R will in general be made with some uncertainty which will contribute to a tolerance with within which the normalised voltage $V_{norm}$ is determined. It will be appreciated that the contribution of the uncertainty in the estimation of the resistance R to the tolerance within which the normalised voltage $V_{norm}$ increases with increasing current I. The tolerance within which the normalised voltage $V_{norm}$, is determined may therefore increase with increasing current I.

Since the tolerance within which the normalised voltage $V_{norm}$ is determined may increase with increasing current, a determined normalised voltage corresponding to a time at which the current is relatively low (and thus the normalised voltage is determined within a relatively low tolerance) may be used to apply a correction to a determined normalised voltage corresponding to a time at which the current is relatively high (and thus the normalised voltage is determined within a relatively large tolerance).

Figure 7:
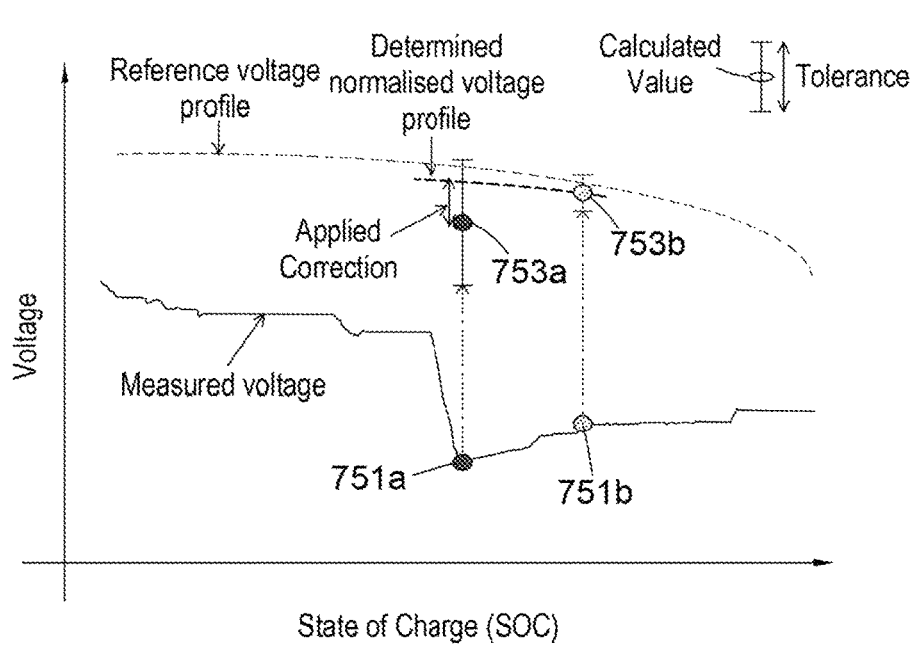
FIG. 7 is a schematic representation of a measured voltage of a battery cell as a function of state of charge during a portion of a variable current drive cycle.

FIG. 7 is a schematic representation of a measured voltage of a battery cell as a function of state of charge (SOC) during a portion of a variable current drive cycle. The profile of measured voltage includes a first measured voltage 751a and a second measured voltage 751b. The first measured voltage 751a correspond to a first time at which a first current flows through the battery cell 101 and the second measured voltage 751b corresponds to a second time at which a second current flows through the battery cell 101, where the first current is greater than the second current. The first measured voltage 751a is used to determine a first normalised voltage 753a corresponding to the first time. The second measured voltage 751b is used to determine a second normalised voltage 753b corresponding to the second time.

Also shown in FIG. 7 is a first tolerance within which the first 753a normalised voltage is determined and a second tolerance within which the second 753b normalised voltage is determined. The first and second tolerances are indicated in FIG. 7 by error bars extending from the first 753a and second 753b normalised voltages respectively. Since the first current (corresponding to the first time) is greater than the second current (corresponding to the second time), the first tolerance is greater than the second tolerance. The accuracy with which the second normalised voltage 753b is determined may thus be greater than the accuracy with which the first normalised voltage 753a is determined. The second normalised voltage may therefore be used to apply a correction to the first normalised voltage, as is indicated in FIG. 7 by the arrow labelled applied correction.

In the example shown in FIG. 7 a normalised voltage profile is determined based on one or more determined normalised voltages. For example, the normalised voltage profile may be determined based on a plurality of determined normalised voltages. As is shown in FIG. 7, the first determined normalised voltage lies relatively far from the determined normalised voltage profile. However, the relatively large tolerance with which the first normalised voltage is determined, is such that the normalised voltage profile still lies within the first tolerance within which the first normalised voltage is determined. The first determined normalised voltage may be corrected in dependence on a plurality of other determined normalised voltages. For example, the first determined voltage 753a may be corrected in dependence on a normalised voltage profile determined from a plurality of different normalised voltages. As is indicated in the example shown in FIG. 7, the first normalised voltage 753a may be corrected such that it substantially lies on the determined normalised voltage profile.

In some embodiments, a correction may be applied to a first normalised voltage if the first normalised voltage is indicative of an increasing state of charge when the cell is discharging or if the first normalised voltage is indicative of a decreasing state of charge when the cell is charging. For example, assuming that the first time is earlier than the second time, a first state of charge determined based on the first normalised voltage should be greater than a second state of charge determined based on the second normalised voltage if the cell is discharging. If the cell is charging then it follows that the first determined state of charge should be less than the second determined state of charge. The first determined state of charge may be compared to the second determined state of charge. It may further be determined whether the cell is charging or discharging between the first and second states of charge. For example, it may be determined whether the cell is charging or discharging based on measurements of the current flowing through the cell made in between the first and second times.

If it is determined that the cell is discharging between the first time and the second time, and the first determined state of charge is less than the first determined state of charge then this may indicate that the first determined normalised voltage includes a relatively large error. In such a scenario a correction may be applied to the first determined normalised voltage. For example, the second determined normalised voltage may be used to apply a correction to the first determined normalised voltage, since the tolerance with which the second normalised voltage is determined is less than the uncertainty with which the the first normalised voltage is determined.

Similarly, if it is determined that the cell is charging between the first time and the second time, and the first determined state of charge is greater than the second determined state of charge then this may indicate that the first determined normalised voltage includes a relatively large error. In such a scenario a correction may be applied to the first determined normalised voltage. For example, the second determined normalised voltage may be used to apply a correction to the first determined normalised voltage, since the tolerance with which the second normalised voltage is determined is less than the uncertainty with the first normalised voltage is determined.

Figure 8:
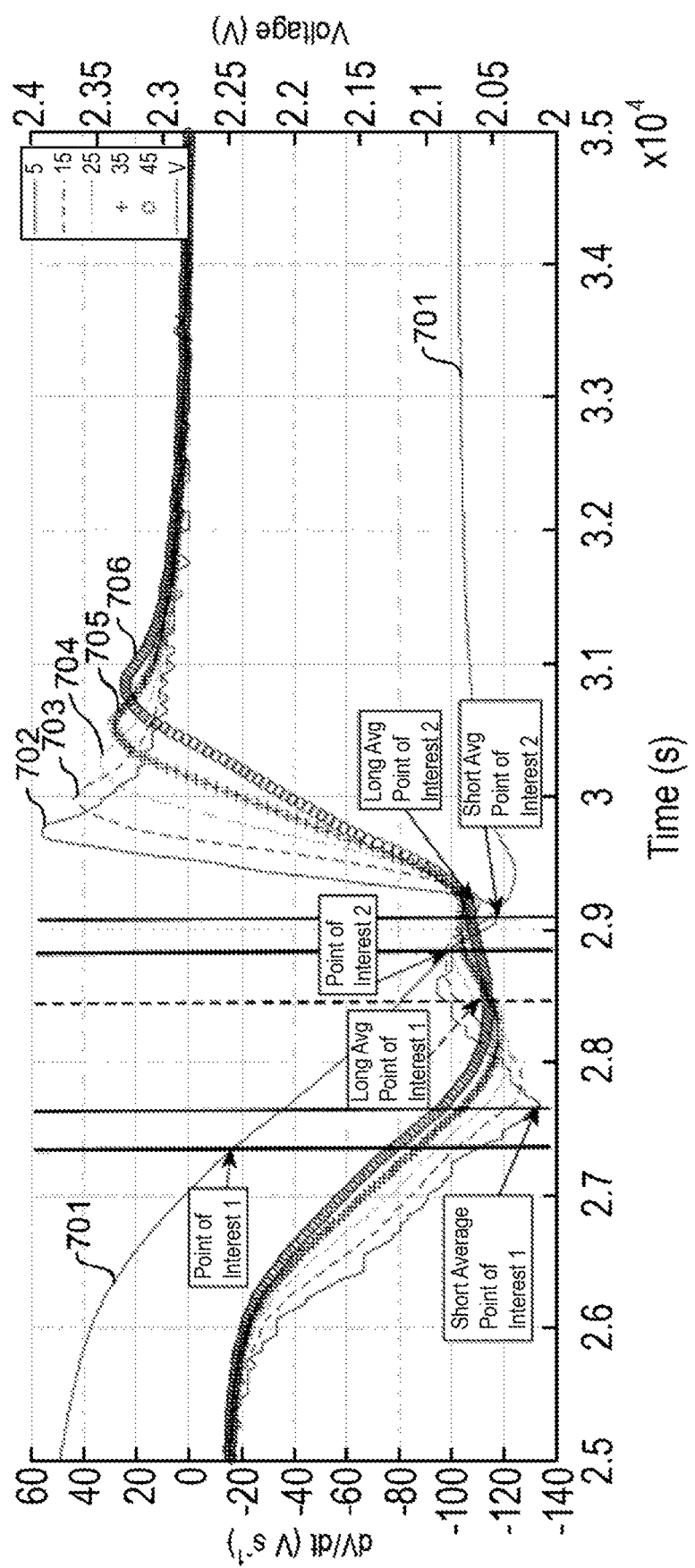
FIG. 8 is a schematic representation of a portion of a voltage series during discharge of a battery cell and of representations of the rate of change of the voltage series.

Embodiments have been described above in which it may be useful to detect one or more features, regions and/or points of interest in a series of voltages (for example, a series of normalised voltages). In some embodiments, a point of interest in a series of voltages may be determined based on a determination of the rate of change of voltage with time. FIG. 8 is a schematic representation of a portion of a voltage series shown as a function of time during discharge of a battery cell. The voltage as a function of time is represented by the curve labelled 701 in FIG. 8. The voltage curve may include a number of points of interest which may, for example, be indicative of changes in state of occurring in the cell.

The voltage of a battery cell can change for a variety of different reasons. As current flows through a battery cell, several electrochemical reactions can take place, which lead to the conversion of chemical species from one oxidative state to another (for example, a change of $s_8^{2-}$ to $S_6^{2-}$ ions in a lithium sulphur battery cell). Additionally or alternatively, chemical species can also undergo chemical reactions and changes. For example, the spontaneous dissociation of $S_6^{2-}$ ions to $S_3^-$ radicals occurs during charge and/or discharge of a lithium sulphur battery cell. Additionally or alternatively one or more physio-chemical processes such as precipitation and dissolution may occur in a battery cell which depend on concentration of species in solution, among many other factors. For example, during discharge of a lithium sulphur battery cell, lithium sulphide forms and dissolves into solution, until it supersaturates. The sudden precipitation of lithium sulphide leads to a marked dip in the voltage of the battery cell which may be referred to as a transition voltage and/or supersaturation voltage. The voltage of the cell may subsequently increase again which may be indicative of an equilibrium being reached, and a rate of lithium sulphide dissolution becoming relatively constant.

In general, a voltage profile of a battery cell may be a reflection of several chemical and/or physio-chemical processes which may take place simultaneously. Changes in the voltage of a battery cell, which may for example appear as a feature or point of interest in a time series of voltage, may be indicative of a change of one or more of these processes which may collectively be referred to as a change of reaction state occurring in a battery cell.

According to some embodiments of the invention one or more points of interest in a voltage series may be identified, where the point of interest may be indicative of a change in reaction state occurring in the battery cell. References herein to a change in reaction state occurring in a battery cell is indented to encompass, for example, one or more of a change in reaction mechanism occurring in the battery cell, a change in reaction rate occurring in the battery cell and/or physio-chemical processes such as precipitation and/or dissolution occurring in the battery cell.

In general, reaction rates in a cell may be dependent on the concentration of one or more chemical species in an approximately logarithmic fashion or in some complex non-linear fashion. Significant changes in the concentration of chemical species may therefore appear as changes in the derivative of cell voltage with respect to time.

The voltage series shown in FIG. 8 may represent a measured voltage of a battery cell at a plurality of different times. For example, the cell monitoring device 104 may measure the voltage of the cell 101 at a plurality of different times, thereby forming a voltage series. Alternatively, a voltage series as described herein may comprise a series of normalised voltages. A series of normalised voltages may be determined using any of the methods and apparatus described above with reference to FIGS. 1-6.

In general, the controller 102 may determine a voltage time series (such as a voltage time series of the type represented in FIG. 8) in dependence on a plurality of measured voltages. The voltage time series may simply correspond directly to measurements of cell voltage made by the cell monitoring device 104. Alternatively, the controller 102 may determine the voltage time series in dependence on measurements of cell voltage made by the cell monitoring device 104. For example, the controller may determine a time series of normalised voltages as described above with reference to FIGS. 1-6.

The voltage series may be represented as a series of n voltage values $V_i$ at a plurality of different times $t_i$, where i is an integer index of the series running from i=1 to i=n.

In order to identify a point of interest in a voltage series which is indicative of a change in reaction state occurring in a cell, the controller 102 may determine the rate of change of the voltage series with respect time. For example, the controller may determine a plurality of rates of change of the voltages with respect to time at different points in the voltage time series. A plurality of rates of change in voltage may be determined by determining a change in voltage over a constant time interval at different times in a voltage time series. For example, the plurality of rates of change may be determined according to equation (2)

$$D_{i+m} = \frac{\partial V}{\partial t_{t_i}} = \frac{V_{i+m} - V_i}{t_{i+m} - t_i} \tag{2}$$

where is a series of rates of change of voltage, where each rate of change is evaluated over m time steps. That is, each rate of change $D_{i+m}$ represents the rate of change of voltage $V_i$ between times $t_i$ and $t_{i+m}$. The sampling rate m or number of time steps over which each rate of change is taken may be chosen to be any suitable value.

In order to detect one or more points or features of interest in the voltage series $V_i$ it may be desirable to smooth out noise which may appear in the series D of rates of change. In order to reduce the effects of noise in the series D of rates of change, the controller 102 may determine a plurality of averages $A_i$ of the rates of change. Each determined average $A_i$ may comprise an average (e.g. a mean) of a subset of the plurality of rates of change, where each subset comprises a number k of consecutive rates of change. The controller may determine a series $A_i$ of averages according to equation (3)

$$A_i = \frac{\sum_k D_i}{k} \quad (3)$$

where k is a number of consecutive rates of change included in each subset of rates of change over which an average is taken.

In some embodiments a series of normalised averages may be determined. For example, a series of averages normalised with respect to a time interval may be determined. The time interval with respect to which each average is normalised may represent a time interval over which the subset k of rates of change (on which the average is based) extend. For example, in some embodiments the controller may determine a series $A_i$ of normalised averages according to equation (4)

$$A_i = \frac{\sum_k D_i}{k \Delta t_k} \quad (4)$$

where $\Delta t_k$ is a time interval corresponding to a time period over which the subset k of plurality of rates of change extend. That is, the subset k of rates of change are determined based on voltages measured over the time interval $\Delta t_k$. It will be appreciated that an average taken over a plurality of rates of change and normalised with respect to a time interval over which the averaged rates of change extend (as given, for example, by equation (4)) is indicative of the second derivative of the voltage with respect to time.

For the purposes of the description provided herein, a normalised average, such as an average normalised with respect to a time period is considered to be an example of an average and a time series of normalised averages of rates of change is considered to be an example of a time series of averages of rates of change.

In some embodiments a plurality of different series of averages may be determined where each series of averages comprises averages over subsets comprising different numbers k of consecutive rates of change. The plurality of different series of averages may, for example, be normalised averages. For example, the series of averages may be normalised with respect to a time interval, as described above. For example, a plurality of first averages may be determined where each of the plurality of first averages comprises an average of a subset comprising a first number k of consecutive rates of change. A plurality of second averages may further be determined where each of the plurality of second averages comprises an average of a subset comprising a second number k of consecutive rates of change, where the second number is different to the first number.

Also shown in FIG. 8 is a plurality of different series of averages (702-706) of rates of change of the voltage series 701. Each of the series of averages (702-706) is determined by taking averages over subsets of the series of rates of change D comprising different numbers k of consecutive rates of change. The solid line labelled 702 in FIG. 8 represents averages taken over subsets comprising 5 consecutive rates of change (i.e. k=5). The dashed line labelled 703 in FIG. 8 represents averages taken over subsets comprising 15 consecutive rates of change (i.e. k=15). The dotted line labelled 704 in FIG. 8 represents averages taken over subsets comprising 25 consecutive rates of change (i.e. k=25). The crosses labelled 705 in FIG. 8 represents averages taken over subsets comprising 35 consecutive rates of change (i.e. k=35). The circles labelled 706 in FIG. 8 represents averages taken over subsets comprising 45 consecutive rates of change (i.e. k=45).

It can be seen in FIG. 8 that the larger the subsets over which averages are taken (i.e. the larger the value of k) the smoother the series of averages appears. For example, the series of averages represented by the solid line labelled 702 in FIG. 8 (for which k=5) includes some visible noise, whereas other lines shown in FIG. 8 representing series of averages for large values of k include less visible noise.

One or more of the series of averages 702-706 may be used to identify one or more points of interest in the series of voltages $V_i$. For example, a first point of interest in the series of voltages $V_i$ is labelled as point of interest 1 in FIG. 8. The first point of interest appears as an inflection point in the series of voltages J. However, the precise location of the inflection point may not be easily discernible from the voltages $V_i$ alone. The first point of interest may be determined in a time series of averages 702-706. For example, as can be seen in FIG. 8, the first point of interest appears as a local minimum in the series of averages 702-706. The local minimum, in the series of averages for which k=5, which corresponds to the first point of interest is labelled in FIG. 8 as the short average point of interest 1. The local minimum, in the series of averages for which k=45, which corresponds to the first point of interest is labelled in FIG. 8 as the long average point of interest 1.

As can be seen in FIG. 8, the local minimums corresponding to the first point of interest, appear at different times in the different series of averages 702-706. This is because each series of averages 702-706 effectively lags behind the corresponding voltage series 701, due to the need to collect enough data points in the voltage series 701 to determine the respective average. The lag between the voltage series 701 and the series of averages 702-706 increases with increases in the value of k. For example, the local minimum corresponding to the first point of interest appears later in the series of averages labelled 706 (k=45) than in the series of averages labelled 702 (k=5).

Also labelled in FIG. 8 is a second point of interest in the voltage series $V_i$ (labelled point of interest 2). Similarly, to the first point of interest, the second point of interest is identifiable as local minimums in the series of averages 702-706. The corresponding local minimums in two of the series of averages 702-706 are labelled short average point of interest 2 and long average point of interest 2 in FIG. 8.

A point of interest in the voltage series $V_i$ may be determined by identifying a feature in at least one time series of averages. For example, the first point of interest shown in FIG. 8 may be determined by identifying a local minimum in one or more of the time series of averages 702-706. In some embodiments a point of interest in a voltage series $V_i$ may be determined by identifying a feature (such as a local minimum or local maximum) in a single time series of averages. For example, the first point of interest shown in FIG. 8 may be determined from one of the time series of averages 702-706.

In other embodiments, a point of interest in a voltage series $V_i$ may be determined by identifying corresponding features in different time series of averages. For example, the first point of interest shown in FIG. 8 may be determined by identifying a local minimum in a first of the time series of averages 702-706 and identifying a corresponding local minimum in a second of the time series of averages 702-706.

As was explained above, the size k of the subset of rates of change over which averages are taken affects the noise in the resulting time series of averages and the time at which a given feature appears in the time series of averages. For example, in general the smaller the value of k which is used, the noisier the resulting time series of averages and the earlier in the time series of averages a given feature appears. For example, the time series of averages labelled 702 (k=5) appears to include a relatively large noise contribution when compared to the other time series of averages 703-706 shown in FIG. 8. The local minimums corresponding to the first and second points of interest appear earliest in the time series of averages labelled 702 (k=5), followed by the other time series of averages (in order of ascending values of k).

In some embodiments, a time series of averages corresponding to a relatively low value of k (e.g. the time series labelled 702) may provide an early indication of the point of interest in a voltage series. However, the time series of averages corresponding to a relatively low value of k may be include a relatively large noise contribution. In some situations noise in a time series of averages corresponding to a relatively low value of k may cause a feature (such as a local minimum or local maximum) to be identified in the time series of averages which does not correspond to a point of interest in the voltage series but is merely a result of noise in the averages.

In order to avoid the false-detection of points of interest caused by noise, in some embodiments, detection of a point of interest may be confirmed by identifying corresponding features in two or more different time series of interest. For example, the local minimum corresponding to the first point of interest may initially may identified in the time series of averages labelled 702 (k=5) in FIG. 8. This may advantageously provide an early indication of the identification of a point of interest. In order to confirm the identification of the point of interest, a corresponding local minimum may then be identified in one or more of the other time series of averages 703-706. In the event that no corresponding feature (i.e. a local minimum in this case) is identified in one or more of the other time series of averages 703-706 then it may be determined that the local minimum identified in the time series of averages labelled 702 was merely a noise feature and does not correspond to a point of interest in the voltage series $V_i$.

Some points of interest in a voltage series $V_i$ may correspond to a feature which is more easily identifiable in one or more of a plurality of times series of averages (each having a different value of k) than in others of the plurality of time series of averages. For example, a first point of interest may be more easily identifiable in a first time series of averages having a first value of k, whereas a second point of interest may be more easily identifiable in a second time series of averages having a second value of k. In some embodiments, a first point of interest in a voltage series may be determined by identifying a feature (such as a local minimum or local maximum) in a first time series of averages and a second point on interest in the voltage series may be determined by identifying a feature (such as a local minimum or local maximum) in a second time series of averages.

As has been described above, one or more points of interest may be determined in a voltage series by identifying features in a time series of averages of rates of change of the voltage series. One or more determined points of interest in a voltage series may, for example, be used to determine a state of charge of a battery cell and/or a measure of the state of health of the battery cell. As was described above in connection with the determination of a series of normalised voltages, a state of charge of a battery cell may be determined by comparing a voltage series to a reference voltage profile. For example, in some embodiments a point or feature of interest may be determined in a voltage series (using one or more aspects of the methods described above) and the point or feature of interest may be matched to a position of a corresponding point or feature of interest in a reference voltage profile. The position of the corresponding point or feature of interest in the reference voltage profile may be indicative of the state of charge of a cell to which the voltage series relates. The voltage series may, for example, be a series of normalised voltages as discussed above or a series of measured voltages.

A point or feature of interest in a voltage series may additionally or alternatively be used to determine a measure of the state of health of a battery cell. For example, a voltage corresponding to a determined point or feature of interest in a voltage series may provide a measure of the state of health of a battery cell.

As is shown in FIG. 8 during charge and discharge of a lithium sulphur cell, the voltage of the cell as a function of capacity or state of charge includes distinctive features 203*a*, 203*b*, 203*c*, 203*d* at which the rate of change of voltage undergoes a distinctive change or transition. It has been found that the voltage of the cell at which at least some of these transitions occur is indicative of a state of health of the cell. For example, it has been found that the voltage (which may be referred to as a transition voltage) at which the transition labelled 203*b* in FIG. 2 occurs, changes during a lifetime of a cell and can provide an indication of ageing of a cell. The transition 203*b* occurs during discharge of a lithium sulphur cell and is normally indicative of supersaturation (the precipitation of lithium sulphide crystals) occurring in the cell.

Figure 9:
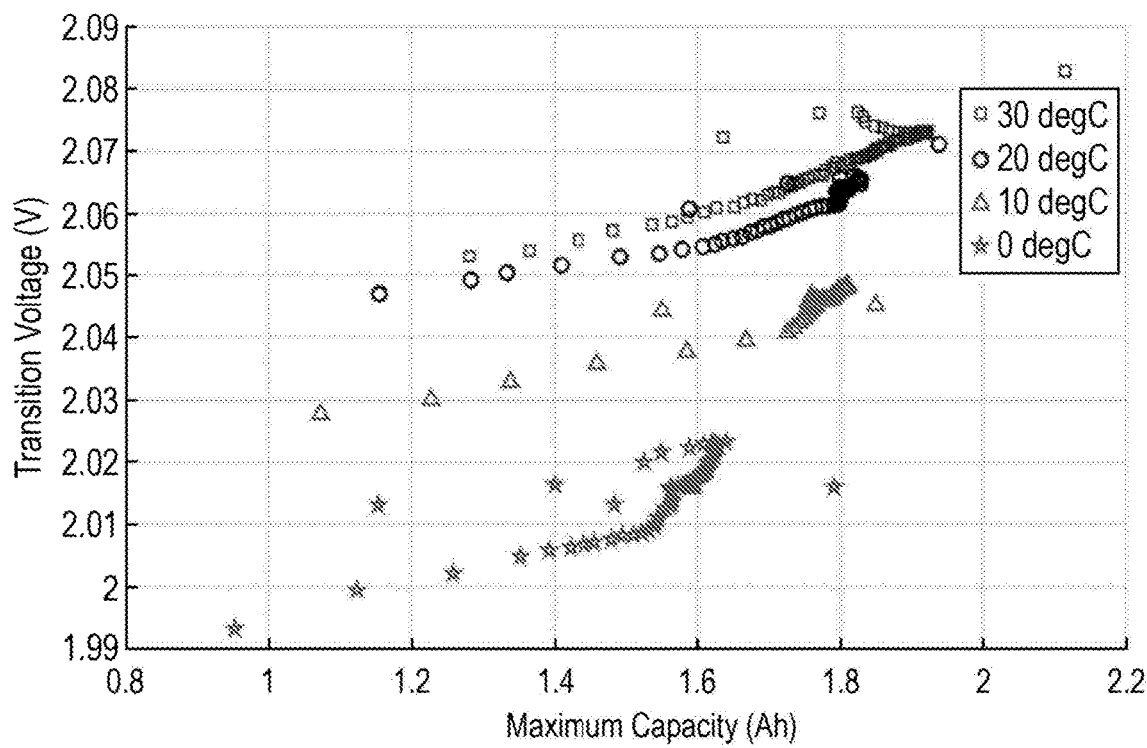
FIG. 9 is a schematic representation of a transition voltage of a plurality of lithium sulphur cells corresponding to a plurality of different charge cycles of the lithium sulphur as a function of a maximum capacity of the cells.

FIG. 9 is a schematic representation of the transition voltage of a number of lithium sulphur cells as a function of the maximum capacity of the cells. Each of the cells represented in FIG. 9 underwent a plurality of charge-discharge cycles at a controlled temperature and at a charge/discharge rate of approximately 0.2 C. The temperature at which the cells underwent successive charge-discharge cycles is represented by the different symbols used in FIG. 9. For example, a first cell which was subjected to charge-discharge cycles at a temperature of approximately 0° C. is represented by stars in FIG. 9. A second cell which was subjected to charge-discharge cycles at a temperature of approximately 10° C. is represented by triangles in FIG. 9. A third cell which was subjected to charge-discharge cycles at a temperature of approximately 20° C. is represented by circles in FIG. 9. A fourth cell which was subjected to charge-discharge cycles at a temperature of approximately 30° C. is represented by squares in FIG. 9. The transition voltage indicated in FIG. 9 is the voltage at which the cells were observed to undergo the transition labelled 203*b* in FIG. 2 during each discharge cycle of the cells. The maximum capacity indicated in FIG. 9 is the maximum useful capacity of the cell during each charge-discharge cycle.

As can be seen in FIG. 9, the transition voltage observed during a discharge cycle is a function both of the temperature at which the discharge cycle takes place and of the maximum capacity of the cell. In general, the transition voltage decreases as the maximum capacity of the cell decreases and the transition voltage tends to be lower for discharge cycles taking place at lower temperatures. The transition voltage may also be a function of the rate at which the battery cell is charged and/or discharged during the cycle in which the transition voltage is determined.

Figure 10:
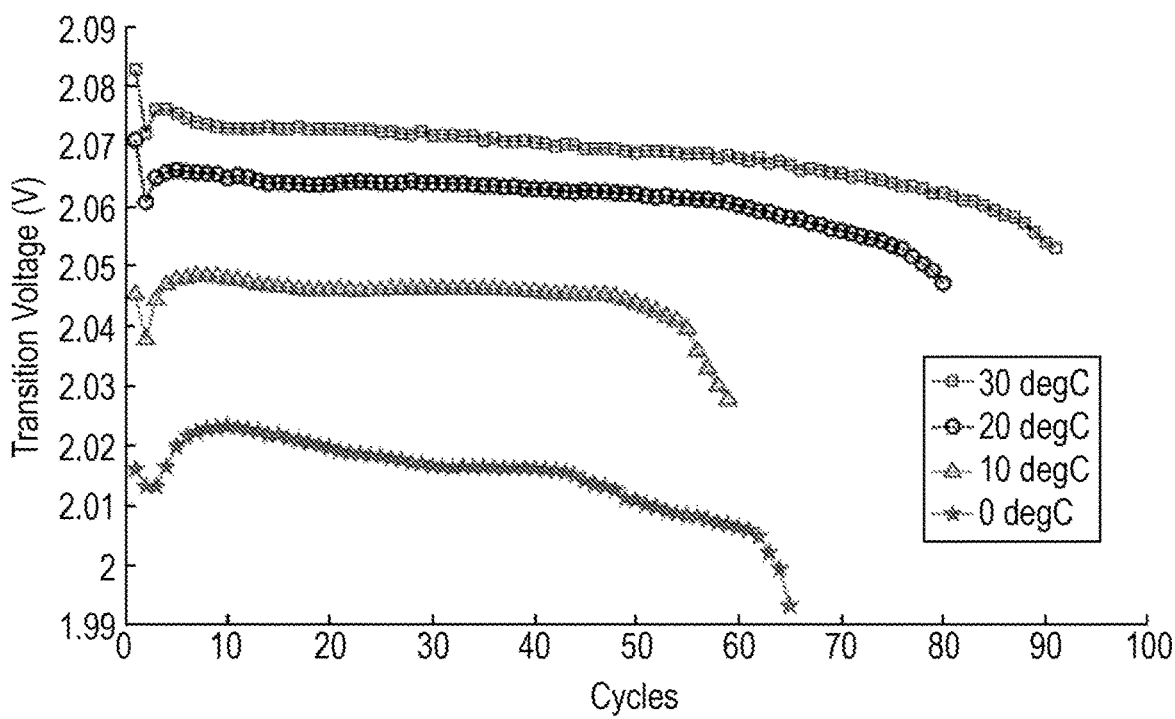
FIG. 10 is a schematic representation of the same transition voltages represented in FIG. 9 as a function of a number of charge cycles undergone by the cell.

FIG. 10 is a schematic representation of the transition voltage of the same cells as a function of the number of charge-discharge cycles which the cells have undergone. The transition voltages represented in FIG. 10 are the same as the transition voltages represented in FIG. 9, except that they are represented as a function of the number of successive charge-discharge cycles undergone by the cells. As can be seen in FIG. 10, after an initial dip and increase early in the lifetime of the cells (the first five charge-discharge cycles or so), the transition voltage of each of the cells tends to decrease as the cells undergo more charge-discharge cycles and therefore age. The decrease in transition voltage with age tends to occur earlier in the life-cycle of the cells and is more pronounced for the cells which undergo charge-discharge cycles at lower temperatures.

Figure 11:
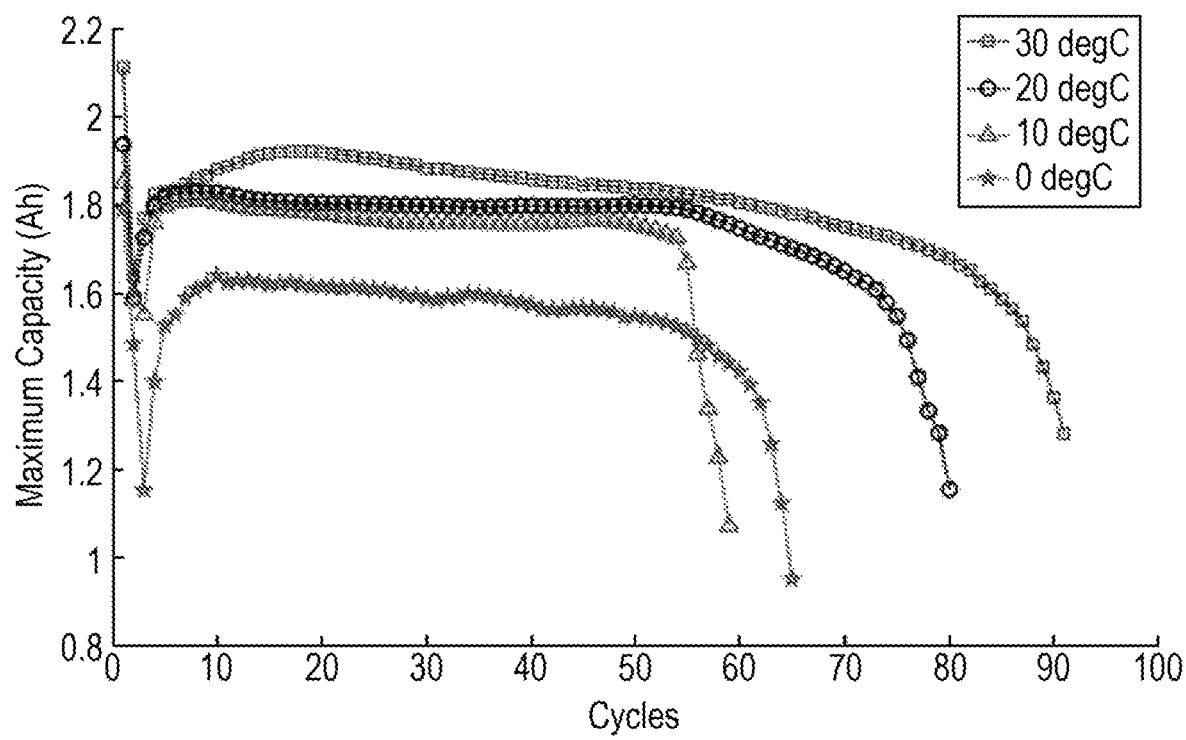
FIG. 11 is a schematic representation of the maximum capacity of the same cells represented in FIGS. 9 and 10 as a function of the number of charge cycles undergone by the cell.

FIG. 11 is a schematic representation of the maximum capacity of the same cells as a function of the number of charge-discharge cycles undergone by the cells. The charge-discharge cycles and the cells represented in FIG. 11 are the same as those represented in FIGS. 9 and 10. As can be seen in FIG. 11, after an initial dip and increase early in the lifetime of the cells (the first five charge-discharge cycles or so) the maximum capacity of the cells tends to decrease as the cells undergo more charge-discharge cycles and therefore age.

The maximum capacities of the cells therefore follows broadly the same trend as the transition voltages of the cells as the cells age and are subjected to more charge-discharge cycles. For this reason the transition voltages of the cells are at least indicative of the maximum capacities of the cells. For example, the transition voltage of a cell tends to exhibit a significant decline with age at approximately the same time as the maximum capacity of the cell undergoes a significant decrease. The transition voltage may therefore provide an indication of the state of health of a cell.

Whilst the transition labelled 203b in FIG. 2 has been described with reference to FIGS. 9-11, other transitions features or points in a cell charge or discharge voltage profile may also be indicative of a state of health of a cell. For example, the voltage at which any of the transitions 203a-203d shown and labelled in FIG. 2 occur may also vary with variations in the maximum capacity of the cell, as discussed above in connection with the transition labelled 203b.

In some embodiments, the controller 102 may be configured to identify at least one portion of a series of voltages in which the voltage undergoes a transition. The series of voltages may be determined in dependence on a plurality of measured voltages. For example, the series of voltages may correspond directly to a plurality of voltages measured by the cell monitoring device 104. In other embodiments, the series of voltages may comprise a series of normalised voltages determined in dependence on a plurality of measured voltages as described above.

The controller may identify at least one portion of the series of voltages in which the voltage undergoes a transition. For example, the controller may identify one or more of the transitions labelled 203a-203d in FIG. 2. An identified portion of the series of voltages in which the voltage undergoes a transition may be indicative of a change in reaction state occurring in the at least one battery cell.

In some embodiments, a portion of the series of voltages in which the voltage undergoes a transition may be identified by determining a rate of change of voltage at a plurality of different positions in the series of voltages. For example, a rate of change of voltage with respect to time, capacity and/or state of charge may be determined. A portion of the series of voltages in which the voltage undergoes a transition may be identified by identifying at least one portion of the series of voltages in which the determine rate of change of voltage undergoes a transition. For example, at least one portion in which the voltage transitions between monotonically increasing or decreasing and remaining substantially constant may be identified. Each of the voltage transitions labelled 203a-203d in FIG. 2 are considered as examples of portions in which the voltage transitions between monotonically increasing or decreasing and remaining substantially constant.

In some embodiments a portion of the series of voltages in which the voltage undergoes a transition may be identified using one or more of the techniques described above with reference to FIG. 8. For example, a plurality of rates of change of voltage may be determined and one or more series of averages of rates of change may be determined. A portion of the series of voltages in which the voltage undergoes a transition may, for example, be identified by detecting a local maximum or local minimum in series of averages of rate of change. In other embodiments any other suitable technique may be used in order to identify a portion of a series of voltages in which the voltage undergoes a transition.

Once a portion of the series of voltage in which the voltage undergoes a transition has been identified, the controller 102 may determine a transition voltage associated with the identified portion. The transition voltage may comprise a voltage in the series of voltages corresponding to the identified portion.

The controller 102 may further determine a measure indicative of the state of health of the battery cell 101 in dependent on the determined transition voltage. The measure indicative of the state of health may, for example, comprise the determined transition voltage. As was explained above with reference to FIGS. 9-11, the transition voltage may be indicative of the age and/or maximum capacity of a cell and may therefore be considered to be a measure indicative of the state of health of the cell. In some embodiments, the measure indicative of the state of health may be any other suitable measure determined in dependence on the transition voltage. For example, the transition voltage may be used to estimate the maximum capacity of the cell 101 and the estimated maximum capacity may form the determined measure indicative of the state of health of the cell 101.

In some embodiments the measure indicative of the state of health of the cell may be determined in dependence on the temperature of the cell during a given charge and/or discharge cycle for which the measure was determined. For example, the measure indicative of the state of health of the cell may comprise a transition voltage normalised with respect to a temperature of the cell during the given charge and/or discharge cycle. As can be seen in FIGS. 9-11, a transition voltage is at least partially dependent on a temperature of the cell during a given charge and/or discharge cycle. Since a cell may undergo different charge-discharge cycles under different temperature conditions during its lifetime, it may be desirable to determine a measure indicative of a state of health of a cell which is substantially independent of the temperature of the cell. A measure indicative of the state of health corresponding to different charge and/or discharge cycles carried out under different temperature conditions may then be usefully compared.

A temperature indicative of the temperature of a cell during a charge and/or discharge cycle may be measured by the cell monitoring device 104. The controller may then determine a measure of the state of health of the cell which is normalised according to the measured temperature.

Similarly, the controller may determine a measure of the state of health of the cell which is normalised according to a rate of charge or discharge of the cell. As was explained above, a transition voltage, on which a measure of the state of health of the cell may be based, may at least partially depend on a charge or discharge current which is flowing through the cell at the time at which the transition voltage is determined. Since a cell may undergo different charge-discharge cycles at different charge and discharge rates during its lifetime, it may be desirable to determine a measure indicative of a state of health of a cell which is substantially independent of the charge or discharge rate of the cell. A measure indicative of the state of health corresponding to different charge and/or discharge cycles carried out at different rates may then be usefully compared.

In some embodiments a series of normalised voltages may be used to determine a transition voltage. As was explained above, a normalised voltage is independent of a current flowing through the cell. Transition voltages determined from a series of normalised voltages corresponding to charge and/or discharge cycles carried out at different charge or discharge rates may therefore be usefully compared.

The controller 102 may store (e.g. in memory forming part of the controller 102) a determined measure indicative of the state of health of the cell corresponding to a plurality of charge and/or discharge cycles. For example, for a plurality of successive charge and/or discharge cycles the controller 102 may determine a measure indicative of the state of health of the cell 101 for each cycle and may store the measure in memory. For example, as is shown in FIG. 10 a transition voltage determined for each of a plurality of successive charge and/or discharge cycles may be stored.

The controller 102 may compare a measure indicative of the state of health of a cell determined and stored for a plurality of different charge and/or discharge cycles. For example, the controller 102 may compare a determined transition voltage of a cell to one or more transition voltages determined for previous charge and/or discharge cycles. The controller 102 may further determine a state of health of the cell based on the comparison. For example, if a determined transition voltage for a given cell is similar to one or more previously determined transition voltages then this may indicate that the cell is in relatively good health.

As is shown in FIG. 10, the transition voltage may remain relatively constant over successive cycles before declining rapidly towards the end of the useful life of the cell (at which time the maximum capacity of the cell also declines). The controller 102 may, for example, determine whether a determined transition voltage differs from one or more previously determined transition voltages (e.g. an average of previously determined transition voltages) by more or less than a threshold amount. If a determined transition voltage differs from one or more previously determined threshold voltages by less than a threshold amount then it may be determined that the cell remains in relatively good health. If a determined transition voltage differs from one or more previously determined threshold voltages by more than a threshold amount then it may be determined that the state of health of the cell has begun to deteriorate and that the cell is nearing the end of its useful lifetime.

A similar comparison could be carried out for one or more measures indicative of the state of health of the cell other than a transition voltage. As was explained above, a measure of the state of health of a cell may be normalised based on a temperature of the cell. This may allow useful comparison to be made between measures determined during different charge and/or discharge cycles carried out during different temperature conditions.

Embodiments have been described above in connection with a battery 100 comprising a single battery cell 101. In some embodiments a battery 100 may comprise a plurality of battery cells 101. A plurality of cells may be connected in series with each other, in parallel with each other or using any suitable combination of series and parallel connections. The methods process and apparatus described above in connection with a single cell 101 are equally applicable to embodiments in which a battery comprises a plurality of cells 101.

In embodiments in which the battery 100 comprises a plurality of battery cells 101, the battery management system 103 may comprise a plurality of cell monitoring devices 104. For example, a cell monitoring device 104 may be provided for each battery cell 101 and may measure at least one property (e.g. current and/or voltage) of the battery cell 101 with which it is associated.

In some embodiments, a battery 100 may include fewer cell monitoring devices 104 than battery cells 101. In such embodiments, a cell monitoring device 104 may be arranged to measure at least one property associated with a plurality of battery cells 101. For example, a cell monitoring device 104 may be arranged to measure a voltage across a plurality of cells 101, a current flowing through a plurality of cells 101 and/or a temperature indicative of the temperature of a plurality of cells 101. The plurality of cells 101 may be connected in series with each other, connected in parallel with each other and/or may be connected in a combination of series and parallel connections. In some embodiments a single cell monitoring device 104 may be provided and may measure one or more properties (e.g. current and/or voltage) of the battery 100 as a whole (which may in some embodiments comprise a plurality of cells 101).

Embodiments have been described above in which a controller 102 determines and/or stores one or more properties related to at least one battery cell 101. The controller may comprise any suitable electronic components.

Figure 12:
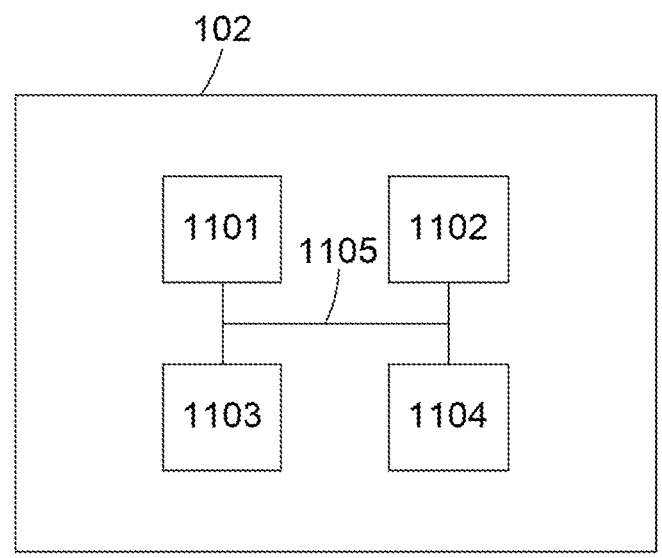
FIG. 12 is a schematic illustration of a controller according to an embodiment of the invention.

FIG. 12 is a schematic illustration of an embodiment of the controller 102. The controller 102 comprises one or more processors 1101 (such as a microprocessor) arranged to execute processing instructions. The instructions may be realised in the form of programming instructions. The controller 102 further comprises memory 1102. The memory may be arranged, for example, to store instructions to be executed by one or more processors 1101. The memory 1102 may be arranged to store data associated with the battery 100. For example, the memory 1102 may be arranged to store measurements made by the cell monitoring device 104 and/or one or more properties determined in dependence on measurements made by the cell monitoring device 104. The memory 1102 may comprise volatile memory, non-volatile memory or a combination of volatile and non-volatile memory.

In the embodiment shown in FIG. 12, the controller 102 further comprises an input 1103 and an output 1104 arranged to communicate with one or more other devices. For example, the input 1103 may be arranged to receive data in the form of an input 105 from the cell monitoring device 104. The output 1104 may be arranged to output the result of one or more computations performed by the one or more processors 1101.

The one or more processors 1101, the memory 1102, the input 1103 and the output 1104 are communicatively coupled with each other by a communications bus 1105.

Embodiments have been described above in which a battery management system is configured to determine one or more properties associated with at least one battery cell. For example, the battery management system may determine one or more of, a series of normalised voltages, one or more points of features of interest in a voltage series, a state of charge of at least one battery cell and/or a measure indicative of the state of health of at least one battery cell.

It will be appreciated that such determined properties have a number of different possible uses. In some embodiments, the battery management system may include an output means for outputting a signal indicative of a determined property. For example, a signal indicative of a determined property (such as a normalised voltage and/or state of charge) may be output to a device which is arranged to draw power from the battery. The device may, for example, control one or more processes on the device in dependence on the output received from the battery management system. For example, the device may control an operating mode and/or a rate at which power is drawn from the battery in dependence on the output received from the battery management system. For example, if the output indicates that the battery has reached a given state of discharge, the device might transition to a low power operating mode in order to reduce a rate at which power is drawn from the battery. In another example, the device might control an operating mode and/or rate at which power is drawn from the battery in dependence on an indication of a state of health of the battery.

In some embodiments, a representation of a determined property associated with at least one battery cell may be output on display. For example, a representation of a determined normalised voltage, a state of charge and/or a state of health of at least one battery cell may be output on a display. This may provide a representation of the internal state of the battery which might guide a user's use of the battery and/or device coupled to the battery. For example, a user might alter the way in which they operate or use a device arranged to draw power from the device in response to a representation output on a display.

In some embodiments, the battery management system may be configured to control charging and/or discharging of at least one battery cell in dependence on a determined property associated with the at least one battery cell. For example, the battery management system may be configured to stop charging of the at least one battery cell when a determined normalised voltage and/or state of charge reaches a threshold normalised voltage and/or state of charge. Additionally or alternatively, the battery management system may be configured to control charging and/or discharging of the at least one battery cell to control a rate of charge and/or discharge in dependence on a determined normalised voltage and/or state of charge.

Additionally or alternatively, the battery management system may be configured to control charging and/or discharging of the at least one battery cell in dependence on a determined measure indicative of the state of health of the at least one battery cell. For example, a voltage (which may be a determined normalised voltage) at which charging of the at least battery cell is stopped during a charging cycle may be adapted in dependence on a determined measure indicative of the state of health of the at least one battery cell. Additionally or alternatively, the battery management system may be configured to control charging and/or discharging of the at least one battery cell to control a rate of charge and/or discharge in dependence on a determined measure indicative of the state of health of the at least one battery cell.

It will be appreciated that there are a large number of different battery control and/or diagnostic processes which may utilise one or more properties (associated with a battery cell) determined according to the methods and apparatus set out herein. The methods and apparatus disclosed herein therefore may have a large number of different uses and the present disclosure is not limited to any specific use of such determined properties.

It will be appreciated that embodiments of the present invention can be realised in the form of hardware, software or a combination of hardware and software. Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of machine-readable storage that are suitable for storing a program or programs that, when executed, implement embodiments of the present invention. Accordingly, embodiments provide a program comprising code for implementing a system or method as claimed in any preceding claim and a machine readable storage storing such a program. Still further, embodiments of the present invention may be conveyed electronically via any medium such as a communication signal carried over a wired or wireless connection and embodiments suitably encompass the same.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A battery management system for determining a time series of normalised voltage of at least one battery cell corresponding to a time period during which a first current flows through the at least one battery cell, the battery management system comprising:
a cell monitoring device configured to measure a current flowing through the at least one battery cell and a voltage of the at least one battery cell at a plurality of different times during the time period; and
a controller configured to determine a normalised voltage of the at least one battery cell for each of the plurality of different times, in dependence on the measured current and measured voltage corresponding to that time, wherein the determined normalised voltages at the plurality of different times form a time series of normalised voltage, wherein the normalised voltage at each of the plurality of different times corresponds to an estimate of a voltage of the at least one battery cell if a second constant current were flowing through the battery cell throughout the time period, where the second constant current is different from the first current.

2. The battery management system of claim 1, wherein the second constant current is a non-zero current.

3. The battery management system of claim 1, wherein the controller is further configured to determine a state of charge of the at least one battery cell in dependence on at least one of the determined normalised voltages.

4. The battery management system of claim 3, wherein determining the state of charge of the at least one battery cell comprises comparing the at least one determined normalised voltage to a reference voltage profile of at least one reference battery cell, wherein the reference voltage profile represents a voltage of the at least one reference battery cell as a function of state of charge.

5. The battery management system of claim 4, wherein comparing the at least one determined normalised voltage to a reference voltage profile comprises matching the at least one determined normalised voltage to a position in the reference voltage profile.

6. The battery management system of claim 5, wherein matching the at least one determined normalised voltage to a position in the reference voltage profile comprises determining a feature of interest in the time series of normalised voltage and matching the feature of interest to a position in the reference voltage profile.

7. The battery management system of claim 3, wherein the controller is further configured to apply a correction to a first determined normalised voltage corresponding to a first time of the plurality of times based on a second determined normalised voltage corresponding to a second time of the plurality of times, wherein the first time corresponds to a time at which the measured current flowing through the at least one battery cell is greater than the measured current flowing through the at least one battery cell at the second time.

8. The battery management system of claim 7, wherein the controller is further configured to:
compare a first determined state of charge corresponding to the first time to a second determined state of charge corresponding to the second time, wherein the first time is earlier than the second time;
determine if the at least one battery cell is charging or discharging between the first time and the second time; and
apply a correction to the first determined normalised voltage if it is determined that the at least one battery cell is discharging between the first time and the second time, and that the first determined state of charge is less than the second determined state of charge, or if it is determined that the at least one battery cell is charging between the first time and the second time and that the first determined state of charge is greater than the second determined state of charge.

9. The battery management system of claim 1, wherein the controller is further configured to:
determine an amount of charge transferred to and/or from the at least one battery cell during the time period based on the measurements of the current flowing through the at least one battery cell at the plurality of different times during the time period; and
determine a state of charge of the at least one battery cell in dependence on the determined amount of charge transferred to and/or from the at least one battery cell during the time period and in dependence on at least one of the determined normalised voltages.

10. The battery management system of claim 9, wherein determining the state of charge of the at least one battery cell comprises:
estimating the state of charge of the at least one battery cell in dependence on the determined amount of charge transferred to and/or from the at least one battery cell during the time period;
comparing the at least one determined normalised voltage to a reference voltage profile of at least one reference battery cell, wherein the reference voltage profile represents a voltage of the at least one reference battery cell as a function of state of charge; and
updating the estimated state of charge in dependence on the comparison.

11. The battery management system of claim 1, wherein the controller is further configured to:
estimate a normalisation factor at each of the plurality of different times; and
determine a normalised voltage for each of the plurality of different times in dependence on the estimated normalisation factor corresponding to that time.

12. The battery management system of claim 11, wherein estimating the normalisation factor of the at least one battery cell at each of the plurality of different times comprises estimating the normalisation factor from normalisation factor reference data.

13. The battery management system of claim 12, wherein the cell monitoring device is further configured to:
measure a temperature indicative of the temperature of the at least one battery cell; and
estimate the normalisation factor from the normalisation factor reference data in dependence on the measured temperature indicative of the temperature of the at least one battery cell.

14. The battery management system of claim 11, wherein the controller is further configured to:
determine an amount of charge transferred to and/or from the at least one battery cell during the time period based on the measurements of the current flowing through the at least one battery cell at the plurality of different times during the time period; and
estimate the normalisation factor from the normalisation factor reference data in dependence on the determined amount of charge transferred to and/or from the at least one battery cell during the time period.

15. The battery management system of claim 11, wherein the controller is further configured to estimate the normalisation factor from the normalisation factor reference data in dependence on history data associated with a usage history of the at least one battery cell.

16. The battery management system of claim 15, wherein the history data is indicative of a number of charge-discharge cycles which the at least one battery cell has undergone during its lifetime.

17. The battery management system of claim 11, wherein the normalisation factor comprises the resistance of the at least one battery cell.

18. The battery management system of claim 17, wherein determining a normalised voltage for each of the plurality of different times comprises:
multiplying the resistance corresponding to that time by the measured current corresponding to that time; and adding the multiple of the estimated resistance and the measured current to the measured voltage corresponding to that time.

19. The battery management system of claim 1, wherein the controller is further configured to:
- determine a plurality of rates of change of the normalised voltage with respect to time at different points in the normalised voltage time series;
- determine a plurality of first averages, wherein each of the plurality of first averages comprises an average of a subset of the plurality of rates of change comprising a first number of consecutive rates of change, wherein the plurality of first averages forms a time series of first averages; and
- determine a first point of interest in the voltage series by identifying a feature in the time series of first averages, wherein the first point of interest is indicative of a change in reaction state occurring in the at least one battery cell.

20. The battery management system of claim 1, wherein the controller is further configured to:
- identify at least one portion of the series of normalised voltages in which the normalised voltage undergoes a transition;
- determine a transition voltage from the normalised voltage series, wherein the transition voltage is associated with the identified at least one portion of the series of normalised voltages in which the voltage undergoes a transition; and
- determine a measure indicative of the state of health of the at least one battery cell in dependence on the transition voltage.

21. A method for determining a time series of normalised voltage of at least one battery cell corresponding to a time period during which a first current flows through the at least one battery cell, the method comprising:
- measuring a current flowing through the at least one battery cell and a voltage of the at least one battery cell at a plurality of different times during the time period; and
- determining a normalised voltage of the at least one battery cell for each of the plurality of different times, in dependence on the measured current and measured voltage corresponding to that time, wherein the determined normalised voltages at the plurality of different times form a time series of normalised voltage,
- wherein the normalised voltage at each of the plurality of different times corresponds to an estimate of a voltage of the at least one battery cell if a second constant current were flowing through the battery cell throughout the time period, where the second constant current is different from the first current.

22. A non-transitory computer readable medium encoded with instructions that, when executed in hardware, perform the method according to claim 21.

* * * * *